(12) United States Patent
Yang et al.

(10) Patent No.: US 11,804,384 B2
(45) Date of Patent: Oct. 31, 2023

(54) DEVICE FOR SELF-ASSEMBLING SEMICONDUCTOR LIGHT-EMITTING DIODES MAGNETS IN A PLURALITY OF ROWS

(71) Applicant: LG ELECTRONICS INC., Seoul (KR)

(72) Inventors: Inbum Yang, Seoul (KR); Junghun Rho, Seoul (KR); Imdeok Jung, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 618 days.

(21) Appl. No.: 16/842,323

(22) Filed: Apr. 7, 2020

(65) Prior Publication Data
US 2021/0090909 A1 Mar. 25, 2021

(30) Foreign Application Priority Data
Sep. 19, 2019 (KR) .................. 10-2019-0115574
Sep. 27, 2019 (KR) .................. 10-2019-0120058

(51) Int. Cl.
| H01L 21/67 | (2006.01) |
| H01L 21/68 | (2006.01) |
| H01L 25/075 | (2006.01) |

(52) U.S. Cl.
CPC .. *H01L 21/67011* (2013.01); *H01L 21/67253* (2013.01); *H01L 21/68* (2013.01); *H01L 25/0753* (2013.01)

(58) Field of Classification Search
CPC ............ H10K 59/129; H01L 21/67011; H01L 21/67253; H01L 21/68; H01L 25/0753
See application file for complete search history.

(56) References Cited

U.S. PATENT DOCUMENTS

| 7,727,788 B2 | 6/2010 | Han et al. |
| 9,825,202 B2 | 11/2017 | Schuele et al. |
| 2006/0196415 A1 | 9/2006 | Lee et al. |
| 2008/0218299 A1 | 9/2008 | Arnold |
| 2009/0265929 A1 | 10/2009 | Nakagawa et al. |
| 2011/0179640 A1 | 7/2011 | Arnold et al. |
| 2011/0277917 A1 | 11/2011 | Nakagawa |

(Continued)

FOREIGN PATENT DOCUMENTS

| CN | 106816451 A | 6/2017 |
| CN | 107833525 A | 3/2018 |

(Continued)

*Primary Examiner* — Michael Jung
(74) *Attorney, Agent, or Firm* — Birch, Stewart, Kolasch & Birch, LLP

(57) ABSTRACT

Discussed is a device for self-assembling semiconductor light-emitting including: a chip supply part to supply the semiconductor light-emitting diodes to the substrate in cooperation with magnets disposed in a plurality of rows to form the magnetic field, wherein the chip supply part includes: a chip accommodating part to accommodate the semiconductor light-emitting diodes; a vertical moving part to adjust a distance between the chip supply part and the magnets; a horizontal moving part to move the chip supply part such that the chip accommodating part is alternately overlapped with a part of the magnets; and a controller to drive the vertical and horizontal moving parts to control a position of the chip supply part, and the controller moves the chip supply part in at least one of a horizontal direction and a vertical direction at a predetermined path and a plurality of points existing on the predetermined path.

20 Claims, 32 Drawing Sheets

(56) References Cited

U.S. PATENT DOCUMENTS

| | | | |
|---|---|---|---|
| 2012/0291950 A1 | 11/2012 | Sugiyama et al. | |
| 2013/0302935 A1 | 11/2013 | Dai et al. | |
| 2014/0097088 A1 | 4/2014 | Stowell et al. | |
| 2015/0228622 A1 | 8/2015 | Koyanagi et al. | |
| 2016/0126049 A1 | 5/2016 | Ahn et al. | |
| 2016/0155892 A1 | 6/2016 | Li et al. | |
| 2017/0229330 A1 | 8/2017 | Tkachenko et al. | |
| 2018/0012873 A1 | 1/2018 | Lee et al. | |
| 2018/0033986 A1 | 2/2018 | Takai et al. | |
| 2018/0102352 A1 | 4/2018 | Sasaki et al. | |
| 2018/0158713 A1 | 6/2018 | Okita et al. | |
| 2018/0190614 A1 | 7/2018 | Kumar et al. | |
| 2018/0312421 A1 | 11/2018 | Garner et al. | |
| 2019/0058080 A1 | 2/2019 | Ahmed et al. | |
| 2019/0058081 A1 | 2/2019 | Ahmed et al. | |
| 2019/0304950 A1* | 10/2019 | Israel | H01L 24/97 |

FOREIGN PATENT DOCUMENTS

| | | | |
|---|---|---|---|
| CN | 108682312 A | | 10/2018 |
| DE | 10 2016 011 747 A1 | | 3/2018 |
| JP | 7-297210 A | | 11/1995 |
| JP | 2003-129297 A | | 5/2003 |
| JP | 2005-326873 A | | 11/2005 |
| JP | 2010-45145 A | | 2/2010 |
| JP | 2011-211136 A | | 10/2011 |
| JP | 2017-539097 A | | 12/2017 |
| KR | 10-2007-0096212 A | | 10/2007 |
| KR | 10-0928951 B1 | | 11/2009 |
| KR | 10-2015-0005628 A | | 1/2015 |
| KR | 10-2017-0071514 A | | 6/2017 |
| KR | 10-2018-0115584 A | | 10/2018 |
| KR | 10-2019-0017691 A | | 2/2019 |
| KR | 10-2019-0018385 A | | 2/2019 |
| KR | 10-2019-0085892 A | | 7/2019 |
| KR | 10-2019-0097946 A | | 8/2019 |
| KR | 10-2019-0099164 A | | 8/2019 |
| KR | 10-2019-0105537 A | | 9/2019 |
| KR | 10-2020-0014865 A | | 2/2020 |
| KR | 10-2020-0026761 A | | 3/2020 |
| WO | WO 2008/054326 A1 | | 5/2008 |
| WO | WO 2011/114741 A1 | | 9/2011 |

\* cited by examiner

DEVICE FOR SELF-ASSEMBLING SEMICONDUCTOR LIGHT-EMITTING DIODES MAGNETS IN A PLURALITY OF ROWS

CROSS-REFERENCE TO RELATED APPLICATION

Pursuant to 35 U.S.C. § 119(a), this application claims the benefit of earlier filing date and right of priority to Korean Application No. 10-2019-0115574, filed on Sep. 19, 2019, and Korean Application No. 10-2019-0120058, filed on Sep. 27, 2019, the contents of all these applications are incorporated by reference herein in its entirety.

BACKGROUND OF THE INVENTION

1. Field of the Invention

The present disclosure relates to self-assembling in a method for manufacturing a display device, and more particularly, to a device for self-assembling microLEDs.

2. Description of the Related Art

In recent years, in the field of display technology, liquid-crystal displays (LCD), organic light-emitting diode (OLED) displays, microLED displays, etc. have been competing to realize large-area displays.

However, LCDs have problems such as slow response times and the low efficiency of light produced by a backlight, and OLEDs have disadvantages such as short lifetimes, low mass-production yields, and low efficiency.

On the contrary, semiconductor light-emitting diodes (microLEDs) with a diameter or cross-sectional area less than 100 μm, when used in displays, can offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick and place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing a display device by the self-assembly of microLEDs.

In view of this, the present disclosure proposes a new manufacturing device for self-assembling microLEDs.

SUMMARY OF THE INVENTION

One aspect of the present disclosure is to provide a self-assembly device capable of uniformly supplying semiconductor light-emitting diodes to an assembly surface of a substrate.

Another aspect of the present disclosure is to provide a self-assembly device capable of shortening an assembly time of semiconductor light-emitting diodes.

According to an embodiment of the present disclosure, in a device for self-assembling semiconductor light-emitting diodes for placing semiconductor light-emitting diodes at a predetermined position on a substrate accommodated in an assembly chamber accommodating a fluid by using an electric field and a magnetic field, the device for self-assembling semiconductor light-emitting diodes includes: a chip supply part disposed in the assembly chamber and supplying the semiconductor light-emitting diodes to one surface of the substrate in cooperation with magnets disposed in a plurality of rows to form the magnetic field, wherein the chip supply part includes: a chip accommodating part for accommodating the semiconductor light-emitting diodes; a vertical moving part for adjusting a distance between the chip supply part and the magnets; a horizontal moving part for moving the chip supply part such that the chip accommodating part is alternately overlapped with a part of the magnets; and a controller for driving the vertical moving part and the horizontal moving part to control a position of the chip supply part in the assembly chamber, wherein the controller moves the chip supply part in at least one of a horizontal direction and a vertical direction at a predetermined path and a plurality of points existing on the predetermined path.

In one embodiment, the controller can move the chip accommodating part of the chip supply part between a first height and a second height, and the first height is a height which is not affected by the magnetic field formed by the magnets and the second height is a height which the affected by magnetic field formed by the magnets.

In the present embodiment, the plurality of points are points that are overlapped with a part of the magnets, and each of the plurality of points is overlapped with different magnets.

In the present embodiment, the controller stops horizontal movement and vertical movement of the chip supply part for a predetermined time such that the semiconductor light-emitting diodes are supplied to the substrate when the chip accommodating part is positioned at the second height.

In the present embodiment, the controller moves the chip accommodating part to the second height at a point at which the chip accommodating part is overlapped with at least one of the magnets.

In the present embodiment, the controller drives the chip supply part such that the chip supply part has a rising path and a lowering path at each of the plurality of points.

In the present embodiment, the plurality of points are one end and the other end of a plurality of rows in which the magnets are disposed.

In the present embodiment, the controller drives the chip supply part such that the chip supply part has any one of the rising path and the lowering path at each of the plurality of points.

In the present embodiment, a sensor unit for monitoring an amount and distribution state of the semiconductor light-emitting diodes remaining on the chip accommodating part is further included.

In the present embodiment, the controller adjusts a time at which the horizontal movement and the vertical movement of the chip supply part are stopped.

In the present embodiment, the controller adjusts a region of the chip accommodating part overlapped with at least one of the magnets at the plurality of points.

According to an embodiment of the present disclosure, in device for self-assembling semiconductor light-emitting diodes at predetermined positions on a substrate by using an electric field and a magnetic field, the device for self-assembling semiconductor light-emitting diodes includes: a chip supplier to supply the semiconductor light-emitting diodes to one surface of the substrate in cooperation with magnets disposed in a plurality of rows to form the magnetic field, wherein the chip supplier comprises: a chip accommodator to accommodate the semiconductor light-emitting diodes; a mover to move the chip supplier relative to the magnets; and a controller to control a position of the chip supplier via the mover, wherein the controller moves the chip supplier at least one of a horizontal direction and a vertical direction at a predetermined path and a plurality of points existing on the predetermined path that overlaps the magnets.

According to a device for self-assembling semiconductor light-emitting diodes according to an embodiment of the present disclosure, the semiconductor light-emitting diodes can be uniformly supplied to an assembly surface of a substrate.

In addition, since an assembly time is shortened, a self-assembly process can be applied to a large area substrate, and production efficiency can be improved by shortening a tact time.

DETAILED DESCRIPTION OF THE EMBODIMENTS

Description will now be given in detail according to example embodiments disclosed herein, with reference to the accompanying drawings. For the sake of brief description with reference to the drawings, the same or equivalent components can be provided with the same or similar reference numbers, and description thereof will not be repeated. In general, a suffix such as "module" and "unit" can be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings.

Also, it will be understood that when an element, such as a layer, area or substrate is referred to as being "disposed on" another element, the element can be disposed directly on the another element or there are no intervening elements present.

Mobile terminals described herein can include cellular phones, smart phones, laptop computers, digital broadcasting terminals, personal digital assistants (PDAs), portable multimedia players (PMPs), navigators, slate PCs, tablet PC, ultra books, digital TVs, digital signage, head-mounted displays (HMDs), desk top computers and the like. However, it can be easily understood by those skilled in the art that the configuration according to the example embodiments of this specification can also be applied to any device capable of displaying information even though such device is a new type of product to be developed.

Figure 1:
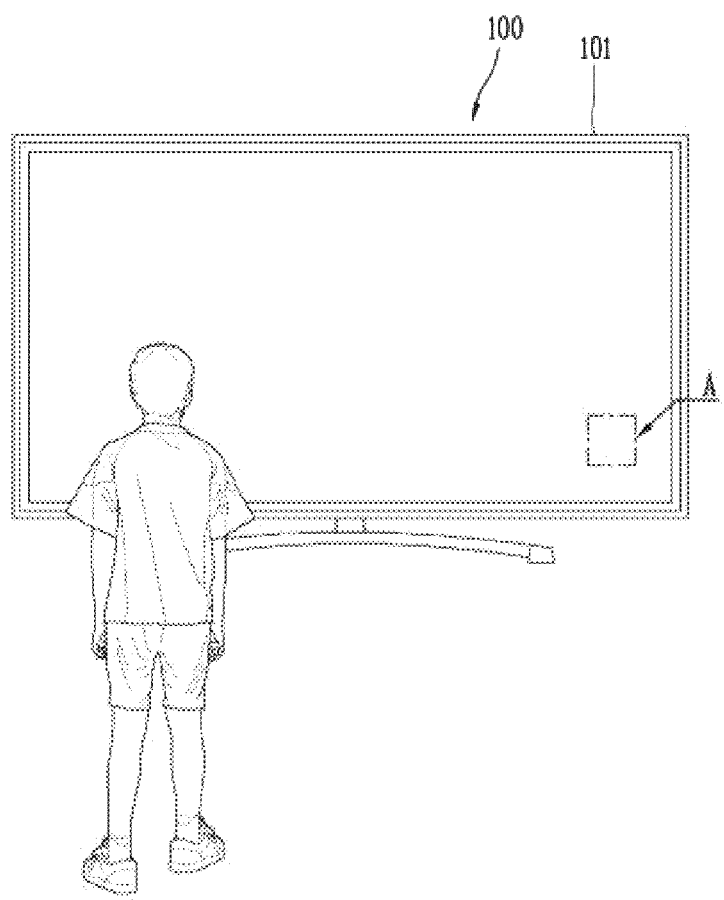
FIG. 1 is a conceptual diagram showing one embodiment of a display device using semiconductor light-emitting diodes according to the present disclosure.
Figure 2:
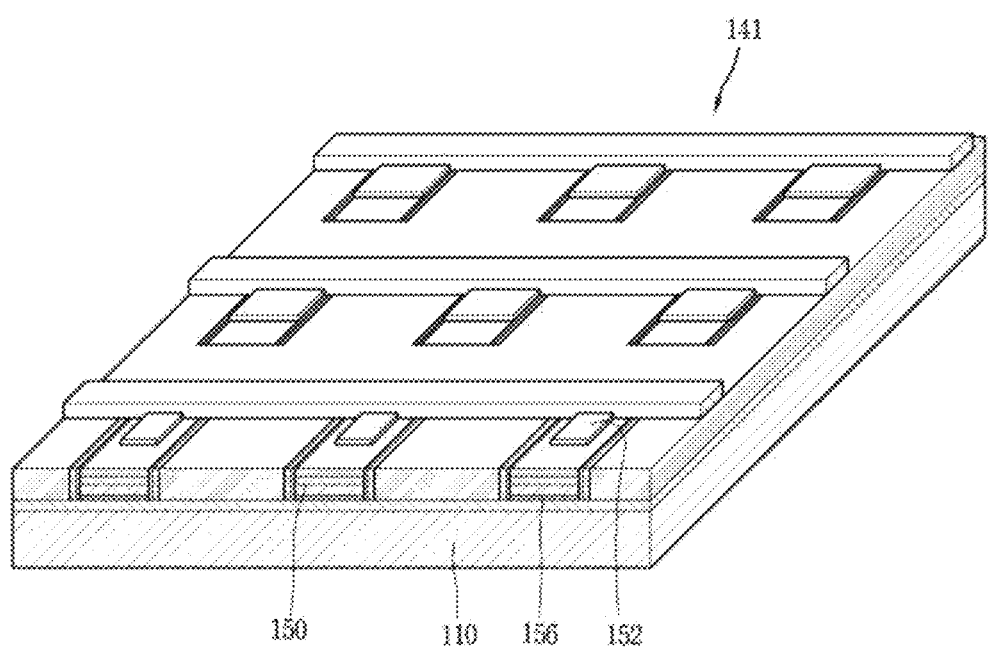
FIG. 2 is a partial enlarged view of the portion A in the display device of FIG. 1.
Figure 3:
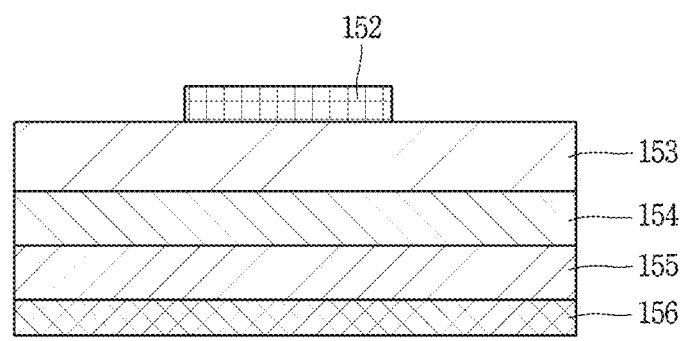
FIG. 3 is an enlarged view of the semiconductor light-emitting diodes of FIG. 2.
Figure 4:
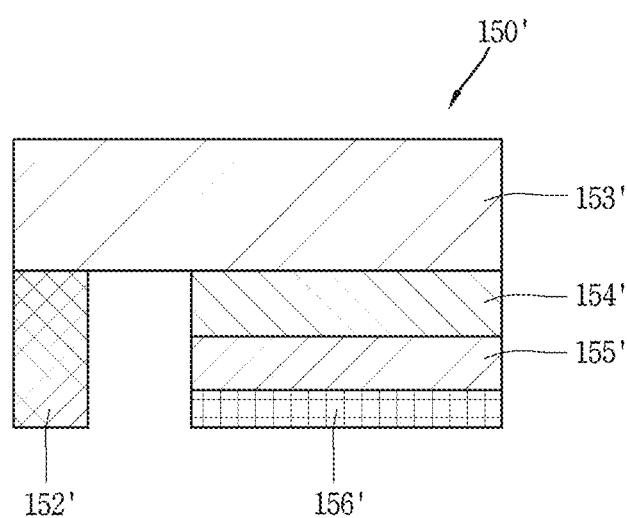
FIG. 4 is an enlarged view showing another embodiment of the semiconductor light-emitting diodes of FIG. 2.

FIG. 1 is a conceptual diagram showing one embodiment of a display device using semiconductor light-emitting diodes according to the present disclosure. FIG. 2 is a partial enlarged view of the portion A in the display device of FIG. 1. FIG. 3 is an enlarged view of the semiconductor light-emitting diodes of FIG. 2. FIG. 4 is an enlarged view showing another embodiment of the semiconductor light-emitting diodes of FIG. 2.

According to the illustration, information processed by a controller of a display device 100 can be outputted by a display module 140. A closed loop-shaped case 101 that runs around the edge of the display module can form the bezel of the display device.

The display module 140 comes with a panel 141 that displays an image, and the panel 141 can come with micro-sized semiconductor light-emitting diodes 150 and a wiring substrate 110 where the semiconductor light-emitting diodes 150 are mounted.

The wiring substrate 110 can be formed with wiring lines, which can be connected to n-type electrodes 152 and p-type electrodes 156 of the semiconductor light-emitting diodes 150. As such, the semiconductor light-emitting diodes 150 can be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes microLEDs (light-emitting diodes) as an example of the semiconductor light-emitting diodes 150 which convert current into light. The microLEDs can be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixels can contain at least three microLEDs.

More specifically, referring to FIG. 3, the semiconductor light-emitting diodes 150 can have a vertical structure.

For example, the semiconductor light-emitting diodes 150 can be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom can be electrically connected to a p electrode of the wiring substrate, and the n-type electrode 152 at the top can be electrically connected to an n electrode above the semiconductor light-emitting diode. One of the biggest advantages of the vertical semiconductor light-emitting diode 150 is that the chip size can be reduced by vertically aligning electrodes.

In another example, referring to FIG. 4, the semiconductor light-emitting diodes can be flip chip-type light-emitting diodes.

As an example of such a flip chip-type light-emitting diode, the semiconductor light-emitting diode 150' comprises a p-type electrode 156', a p-type semiconductor layer 155' formed on the p-type electrode 156', an active layer 154' formed on the p-type semiconductor layer 155', an n-type semiconductor layer 153' formed on the active layer 154', and an n-type electrode 152' vertically separated from the p-type electrode 156', on the n-type semiconductor layer 153'. In this case, both the p-type electrode 156' and the n-type electrode 152' can be electrically connected to a p electrode and n electrode of the wiring substrate, below the semiconductor light-emitting diode.

The vertical semiconductor light-emitting diode and a horizontal light-emitting diode each can be used as a green semiconductor light-emitting diode, blue semiconductor light-emitting diode, or red semiconductor light-emitting diode. The green semiconductor light-emitting diode and the blue semiconductor light-emitting diode can be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes can be composed of gallium nitride thin films which are formed of various layers of n-Gan, p-GaN, AlGaN, InGaN, etc. More specifically, the p-type semiconductor layer can be P-type GaN, and the n-type semiconductor layer can be N-type GaN.

Moreover, the p-type semiconductor layer can be P-type GaN doped with Mg on the p electrode, and the n-type semiconductor layer can be N-type GaN doped with Si on the n electrode. In this case, the above-described semiconductor light-emitting diodes can come without the active layer.

Meanwhile, referring to FIGS. 1 to 4, because of the very small size of the light-emitting diodes, self-emissive, high-definition unit pixels can be arranged on the display panel, and therefore the display device can deliver high picture quality.

In the above-described display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes can be transferred at a time by using a stamp or roll, which, however, is not suitable for large-screen displays because of limited yields. The present disclosure suggests a new method and device for manufacturing a display device that can improve on these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes or other electrical devices. Also, although the illustration will be given of how horizontal semiconductor light-emitting diodes are self-assembled, it also can apply to self-assembling of vertical semiconductor light-emitting diodes and other electrical devices.

Figure 5A:
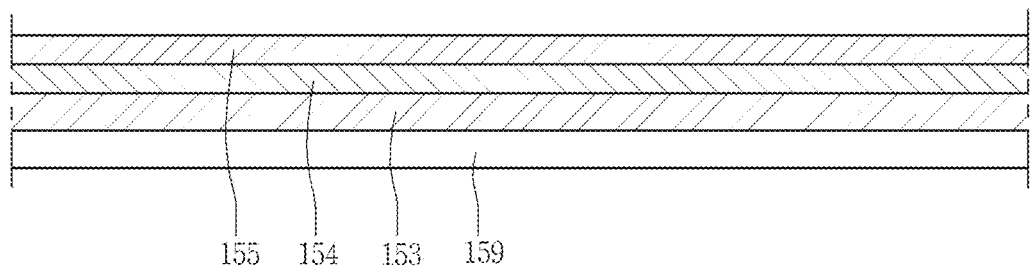
FIGS. 5A to 5E are conceptual diagrams for explaining a new process for manufacturing the above-described semiconductor light-emitting diodes.

First of all, according to the manufacturing method, a first conductive semiconductor layer 153, an active layer 154, and a second conductive semiconductor layer 155 are grown on a growth substrate 159 (see FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 can be a p-type semiconductor layer, and the second conductive semiconductor layer 155 can be an n-type semiconductor layer. However, the present disclosure is not necessarily limited to this, and the first conductive type can be n-type and the second conductive type can be p-type.

Moreover, although this example embodiment is illustrated by assuming the presence of the active layer, the active layer can be omitted if necessary or desired, as stated above. In an example, the p-type semiconductor layer can be P-type GaN doped with Mg, and the n-type semiconductor layer can be N-type GaN doped with Si on the n electrode.

The growth substrate 159 (e.g., a wafer) can be formed of, but not limited to, light-transmissive material—for example, at least one among sapphire ($Al_2O_3$), GaN, ZnO, and AlO. Also, the growth substrate 159 can be made from a material suitable for growing semiconductor materials or carrier wafer. The growth substrate 159 can be formed of high thermal conducting material, and can be a conductive substrate or insulating substrate—for example, at least one among SiC, Si, GaAs, GaP, InP, and $Ga_2O_3$ substrates which have higher thermal conductivity than sapphire ($Al_2O_3$) substrates.

Figure 5B:
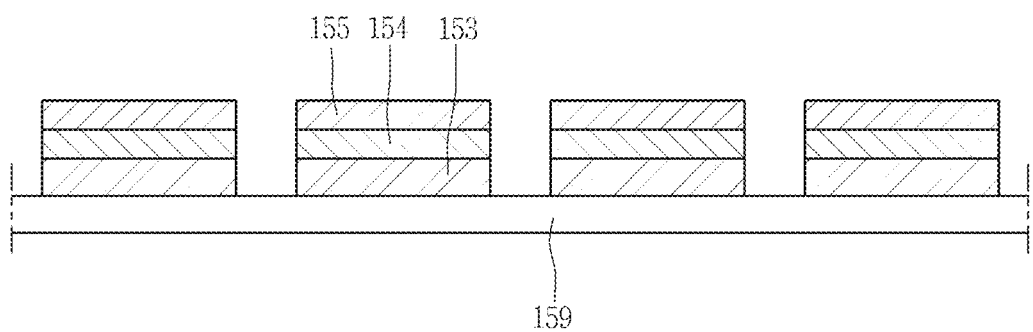

Next, a plurality of semiconductor light-emitting diodes are formed by removing at least part of the first conductive semiconductor layer 153, active layer 154, and second conductive semiconductor layer 155 (see FIG. 5B).

More specifically, isolation is performed so that the light-emitting diodes form a light-emitting diode array. That is, a plurality of semiconductor light-emitting diodes are formed by vertically etching the first conductive semiconductor layer 153, active layer 154, and second conductive semiconductor layer 155.

In the case of horizontal semiconductor light-emitting diodes, a mesa process can be performed which exposes the first conductive semiconductor layer 153 to the outside by vertically removing part of the active layer 154 and second conductive layer 155, and then isolation can be performed which forms an array of semiconductor light-emitting diodes by etching the first conductive semiconductor layer 153.

Figure 5C:
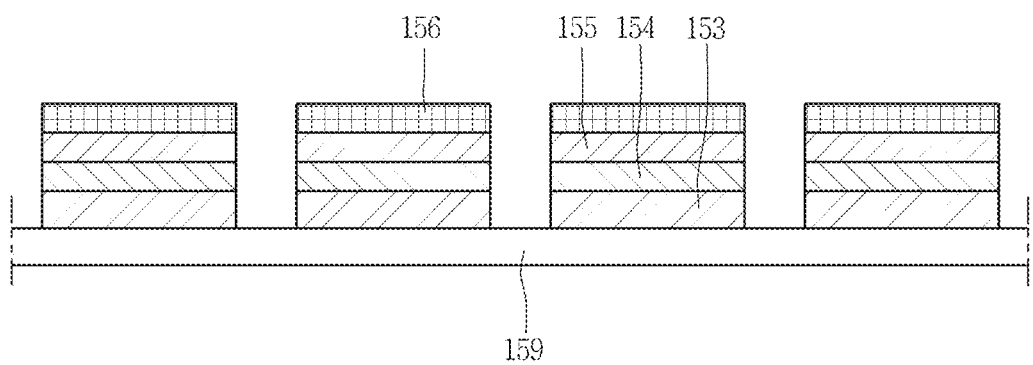
Figure 5D:
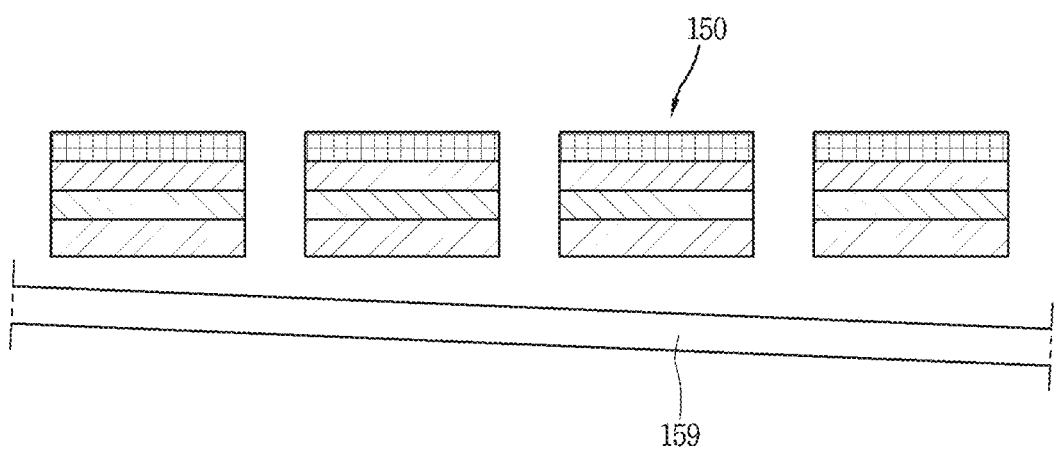

Next, a second conductive electrode 156 (or p-type electrode) is formed on one surface of the second conductive semiconductor layer 155 (see FIG. 5C). The second conductive electrode 156 can be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 can serve as an n-type electrode.

Next, the growth substrate 159 is removed, thus leaving a plurality of semiconductor light-emitting diodes. For example, the growth substrate 159 can be removed using laser lift-off (LLO) or chemical lift-off (CLO) (see FIG. 5D).

Figure 5E:
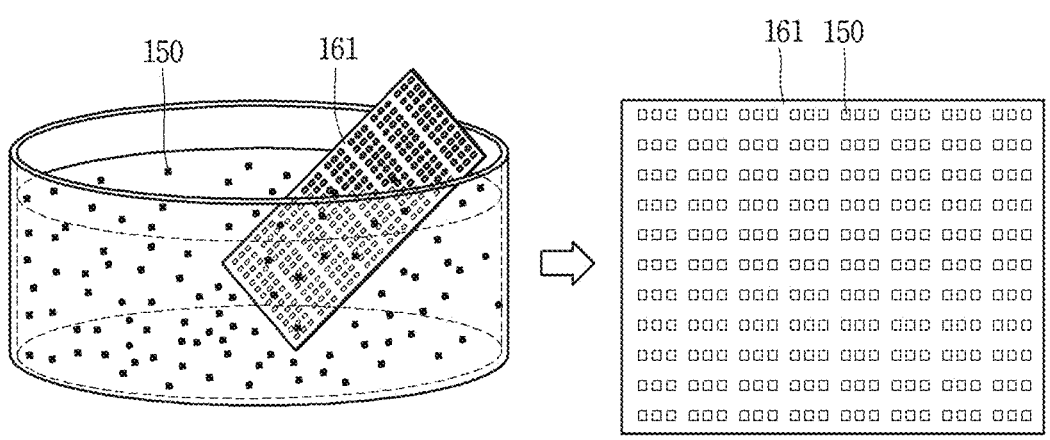

Afterwards, the step of mounting the semiconductor light-emitting didoes 150 on a substrate in a chamber filled with a fluid is performed (see FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate can be an assembly substrate 161.

In another example, a wiring substrate, instead of the assembly substrate 161, can be put into an assembly chamber, and the semiconductor light-emitting diodes 150 can be mounted directly onto the wiring substrate. In this case, the substrate can be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells into which the semiconductor light-emitting diodes 150 are fitted can be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes can be transferred to the wiring substrate from the assembly substrate 161, thereby enabling a large-area transfer across a large area. Thus, the assembly substrate 161 can be referred to as a temporary substrate.

Meanwhile, the above-described self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

Figure 6:
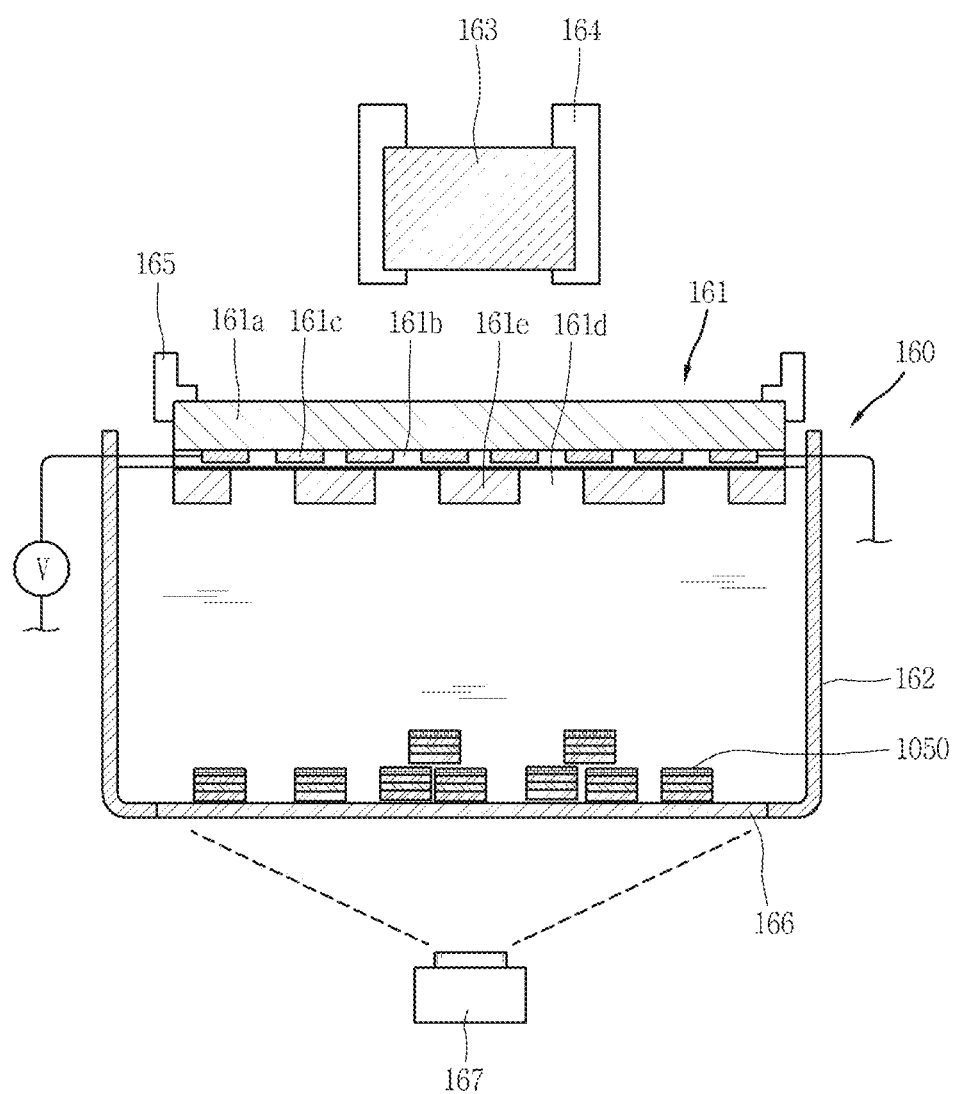
FIG. 6 is a conceptual diagram showing an example of a device for self-assembling semiconductor light-emitting diodes according to the present disclosure.
Figure 7:
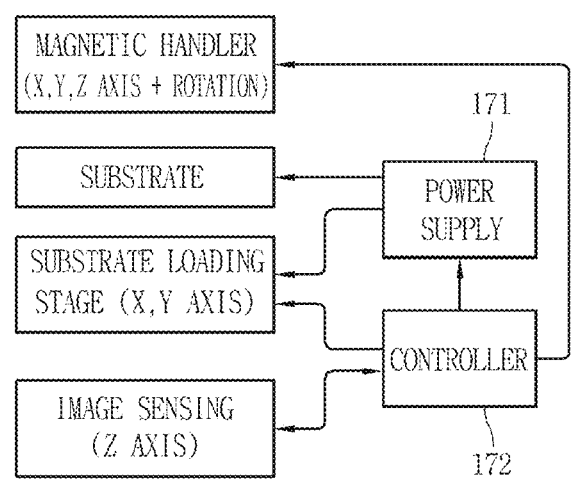
FIG. 7 is a block diagram of the self-assembly device of FIG. 6.

FIG. 6 is a conceptual diagram showing an example of a device for self-assembling semiconductor light-emitting diodes according to the present disclosure. FIG. 7 is a block diagram of the self-assembly device of FIG. 6. FIGS. 8A to 8E are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8E.

Referring to FIGS. 6 and 7, the self-assembly device 160 of the present disclosure can comprise an assembly chamber 162, a magnet 163, and a position controller 164.

The assembly chamber 162 is equipped with space for a plurality of semiconductor light-emitting diodes. The space can be filled with a fluid, and the fluid can be an assembly solution, which includes water or the like. Thus, the assembly chamber 162 can be a water tank and configured as open-type. However, the present disclosure is not limited to this, and the assembly chamber 162 can be a closed-type chamber that comes with a closed space.

A substrate 161 can be placed in the assembly chamber 162 so that an assembly surface where the semiconductor light-emitting diodes 150 are assembled faces downwards. For example, the substrate 161 is fed to an assembly site by a feed unit, and the feed unit can come with a stage 165 where the substrate is mounted. The position of the stage 165 can be adjusted by the controller, whereby the substrate 161 can be fed to the assembly site.

In this instance, the assembly surface of the substrate 161 at the assembly site faces the bottom of the assembly chamber 162. As shown in the drawings, the assembly surface of the substrate 161 is placed in such a way as to be soaked with the fluid in the assembly chamber 162. Thus, the semiconductor light-emitting diodes 150 in the fluid are moved to the assembly surface.

The substrate 161 is an assembly substrate where an electric field can be formed, and can comprise a base portion 161a, a dielectric layer 161b, and a plurality of electrodes 161c.

The base portion 161a is made of insulating material, and the electrodes 161c can be thin-film or thick-film bi-planar electrodes that are patterned on one surface of the base portion 161a. The electrodes 161c can be formed of a stack of Ti/Cu/Ti, Ag paste, ITO, etc.

The dielectric layer 161b can be made of inorganic material such as $SiO_2$, SiNx, SiON, $Al_2O_3$, $TiO_2$, $HfO_2$, etc. Alternatively, the dielectric layer 161b can be an organic insulator and composed of a single layer or multi-layers. The thickness of the dielectric layer 161b can range from several tens of nm to several μm.

Further, the substrate 161 according to the present disclosure comprises a plurality of cells 161d that are separated by partition walls 161e. The cells 161d can be sequentially arranged in one direction and made of polymer material. Also, the partition walls 161e forming the cells 161d can be shared with neighboring cells 161d. The partition walls 161e can protrude from the base portion 161a, and the cells 161d can be sequentially arranged in one direction along the partition walls 161e. More specifically, the cells 161d can be sequentially arranged in column and row directions and have a matrix structure.

As shown in the drawings, the cells 161d can have recesses for accommodating the semiconductor light-emitting diodes 150, and the recesses can be spaces defined by the partition walls 161e. The recesses can have a shape identical or similar to the shape of the semiconductor light-emitting diodes. For example, if the semiconductor light-emitting diodes are rectangular, the recesses can be rectangular too. Moreover, the recesses formed in the cells can be circular if the semiconductor light-emitting diodes are circular. Further, each cell is configured to accommodate one semiconductor light-emitting diode. That is, one cell accommodates one semiconductor light-emitting diode.

Meanwhile, the plurality of electrodes 161c have a plurality of electrode lines that are placed at the bottom of the cells 161d, and the electrode lines can be configured to extend to neighboring cells.

The electrodes 161c are placed on the undersides of the cells 161d, and different polarities can be applied to create an electric field within the cells 161d. To form an electric field, the dielectric layer 161b can form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device can have a magnet 163 for applying magnetic force to the semiconductor light-emitting diodes. The magnet 163 is placed at a distance from the assembly chamber 162 and apply a magnetic force to the semiconductor light-emitting diodes 150. The magnet 163 can be placed to face the opposite side of the assembly surface of the substrate 161, and the positions of the magnet 163 are controlled by the position controller 164 connected to the magnet 163.

The semiconductor light-emitting diodes 1050 can have a magnetic material so that they are moved within the fluid by a magnetic field.

Referring to FIG. 9, a semiconductor light-emitting diode having a magnetic material can comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1053 and where the second conductive semiconductor layer 1055 is placed, and an active layer 1054 placed between the first and second conductive semiconductor layers 1053 and 1055.

Here, the first conductive can refer to p-type, and the second conductive type can refer to n-type, or vice versa. As stated previously, the semiconductor light-emitting diode can be formed without the active layer.

Meanwhile, in the present disclosure, the first conductive electrode 1052 can be formed after the semiconductor light-emitting diode is assembled onto the wiring substrate by the self-assembling of the semiconductor light-emitting diode. Further, in the present disclosure, the second conductive electrode 1056 can comprise a magnetic material. The magnetic material can refer a magnetic metal. The magnetic material can be Ni, SmCo, etc. In another example, the magnetic material can include at least one among Gd-based, La-based, and Mn-based materials.

The magnetic material can be provided in the form of particles on the second conductive electrode 1056. Alternatively, one layer of a conductive electrode comprising a magnetic material can be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a can comprise a magnetic material, and the second layer 1056b can comprise a metal material other than the magnetic material.

As shown in the drawing, in this example, the first layer 1056a comprising the magnetic material can be placed in contact with the second conductive semiconductor layer 1055. In this case, the first layer 1056a is placed between the second layer 1056b and the second conductive semiconductor layer 1055. The second layer 1056b can be a contact metal that is connected to the wiring electrode on the wiring substrate. However, the present disclosure is not necessarily limited to this, and the magnetic material can be placed on one surface of the first conductive semiconductor layer.

Referring again to FIGS. 6 and 7, more specifically, on top of the assembly chamber of the self-assembly device, a magnet handler capable of automatically or manually moving the magnet 163 on the x, y, and z axes or a motor capable of rotating the magnet 163 can be provided. The magnet handler (or magnetic handler) and motor can constitute the position controller 164. As such, the magnet 163 can rotate in a horizontal, clockwise, or counterclockwise direction to the substrate 161.

Meanwhile, the assembly chamber 162 can be formed with a light-transmissive bottom plate 166, and the semiconductor light-emitting diodes can be placed between the bottom plate 166 and the substrate 161. An image sensor 167 can be placed opposite to the bottom plate 166 so as to monitor the inside of the assembly chamber 162 through the bottom plate 166. The image sensor 167 can be controlled by a controller 172, and can come with an inverted-type lens, CCD, etc. so as to observe the assembly surface of the substrate 161.

The above-described self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-described self-assembly device will be described in more details.

First of all, a plurality of semiconductor light-emitting diodes 1050 having a magnetic material can be formed through the process explained with reference to FIGS. 5A to 5C. In this case, the magnetic material can be deposited onto the semiconductor light-emitting didoes in the process of forming the second conductive electrode of FIG. 5C.

Figure 8A:
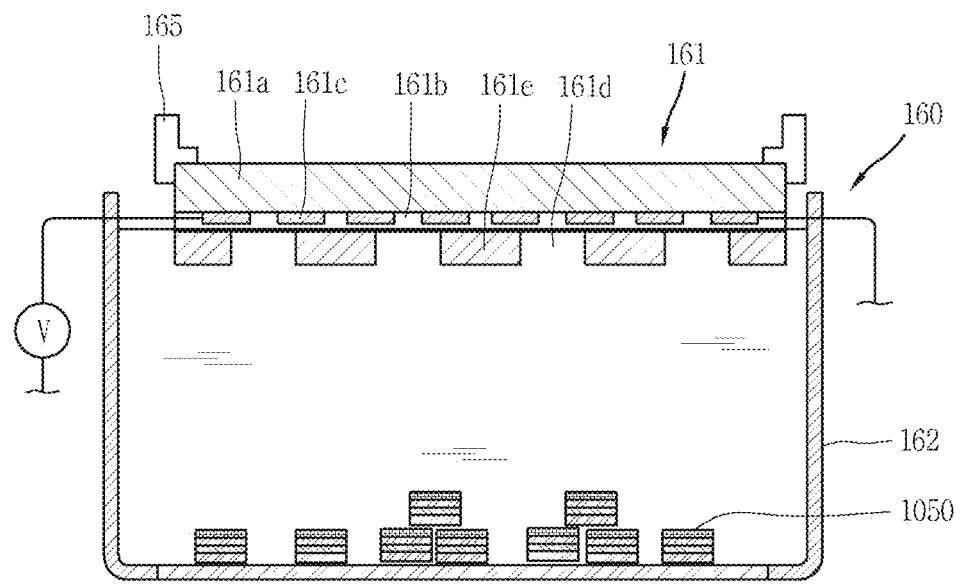
FIGS. 8A to 8E are conceptual diagrams showing a process for self-assembling semiconductor light-emitting diodes using the self-assembly device of FIG. 6.
Figure 9:
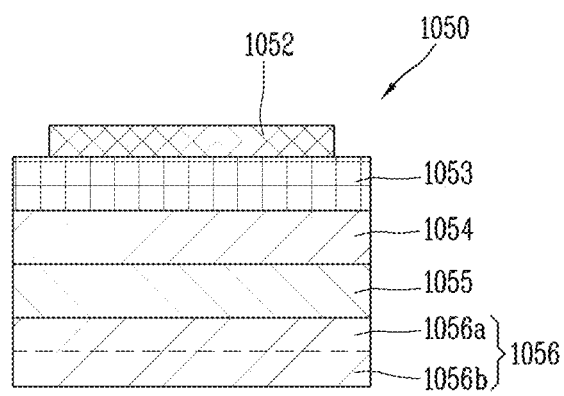
FIG. 9 is a conceptual diagram for explaining the semiconductor light-emitting diodes of FIGS. 8A to 8E.

Next, the substrate 161 is fed to an assembly site, and the semiconductor light-emitting diodes 1050 are put into the assembly chamber 162 (see FIG. 8A).

As described above, the assembly site on the substrate 161 can be a position at which the substrate 161 is placed in the assembly chamber 162 in such a way that an assembly surface where the semiconductor light-emitting diodes 150 are assembled faces downwards.

In this case, some of the semiconductor light-emitting diodes 1050 can sink to the bottom of the assembly chamber 162 and some of them can float in the fluid. If the assembly chamber 162 comes with a light-transmissive bottom plate 166, some of the semiconductor light-emitting diodes 1050 can sink to the bottom plate 166.

Figure 8B:
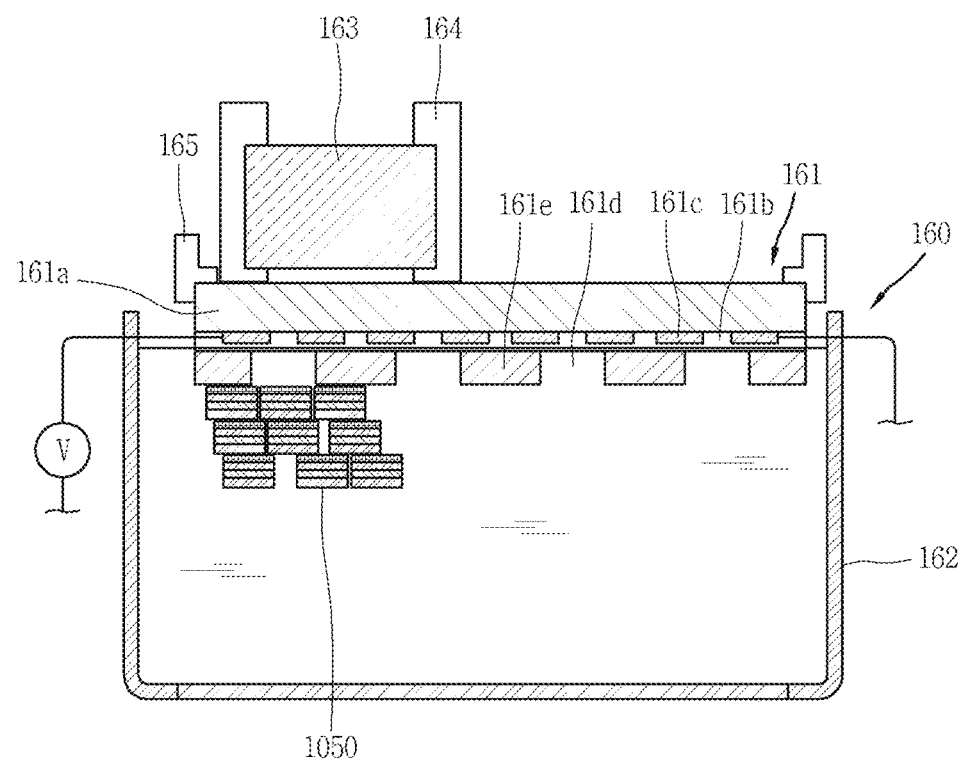

Next, a magnetic force is applied to the semiconductor light-emitting diodes 1050 so that the semiconductor light-emitting diodes 1050 in the assembly chamber 162 come up to the surface (see FIG. 8B).

When the magnet 163 of the self-assembly device move to the opposite side of the assembly surface of the substrate 161 from an original position, the semiconductor light-emitting diodes 1050 float in the fluid towards the substrate 161. The original position can refer to a position at which the magnet 163 is outside the assembly chamber 162. In another example, the magnet 163 can be composed of an electromagnet. In this case, an initial magnetic force is generated by supplying electricity to the electromagnet.

Meanwhile, in this embodiment, the assembly surface of the substrate 161 and the spacing between the semiconductor light-emitting diodes 1050 can be controlled by adjusting the strength of the magnetic force. For example, the spacing is controlled by using the weight, buoyancy, and magnetic force of the semiconductor light-emitting diodes 1050. The spacing can be several millimeters to several tens of micrometers from the outermost part of the substrate 161.

Next, a magnetic force is applied to the semiconductor light-emitting diodes 1050 so that the semiconductor light-emitting diodes 1050 move in one direction within the assembly chamber 162. For example, the 163 can move in a horizontal, clockwise, or counterclockwise direction to the substrate 161 (see FIG. 8C). In this case, the semiconductor light-emitting diodes 1050 are moved horizontally to the substrate 161 by the magnetic force, spaced apart from the substrate 161.

Figure 8C:
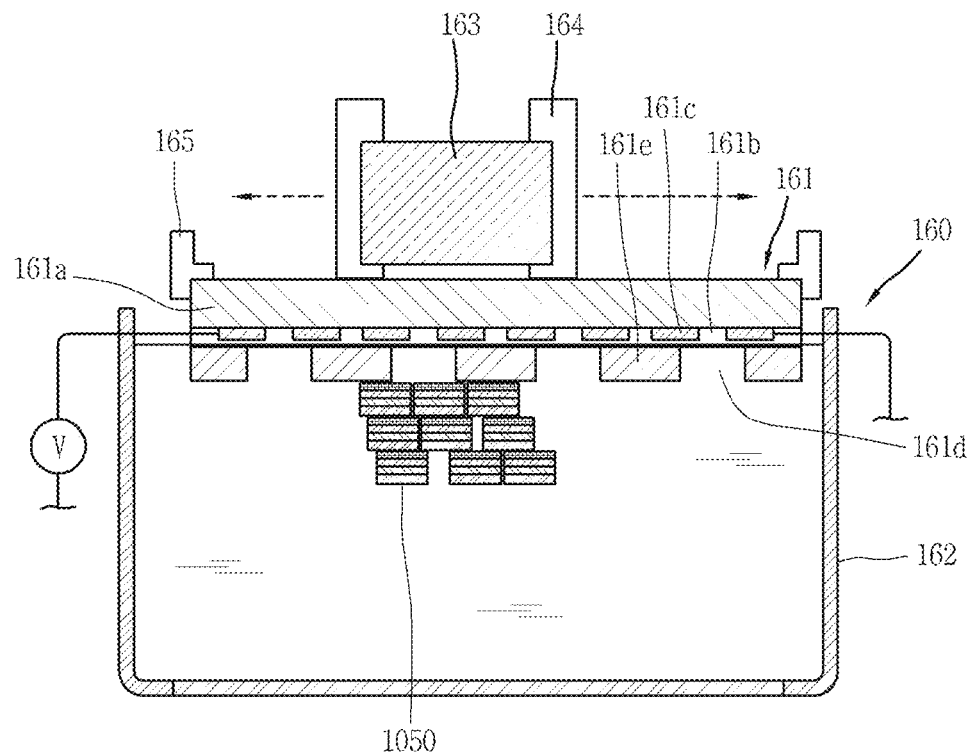

Next, the semiconductor light-emitting diodes 1050 are guided to preset positions on the substrate 161 by applying an electric field so that the semiconductor light-emitting diodes 1050 are mounted at the preset positions while in the process of being moved (see FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 can be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes can be transferred onto a wiring substrate to carry out a subsequent process for realizing the display device, as described previously.

Figure 8D:
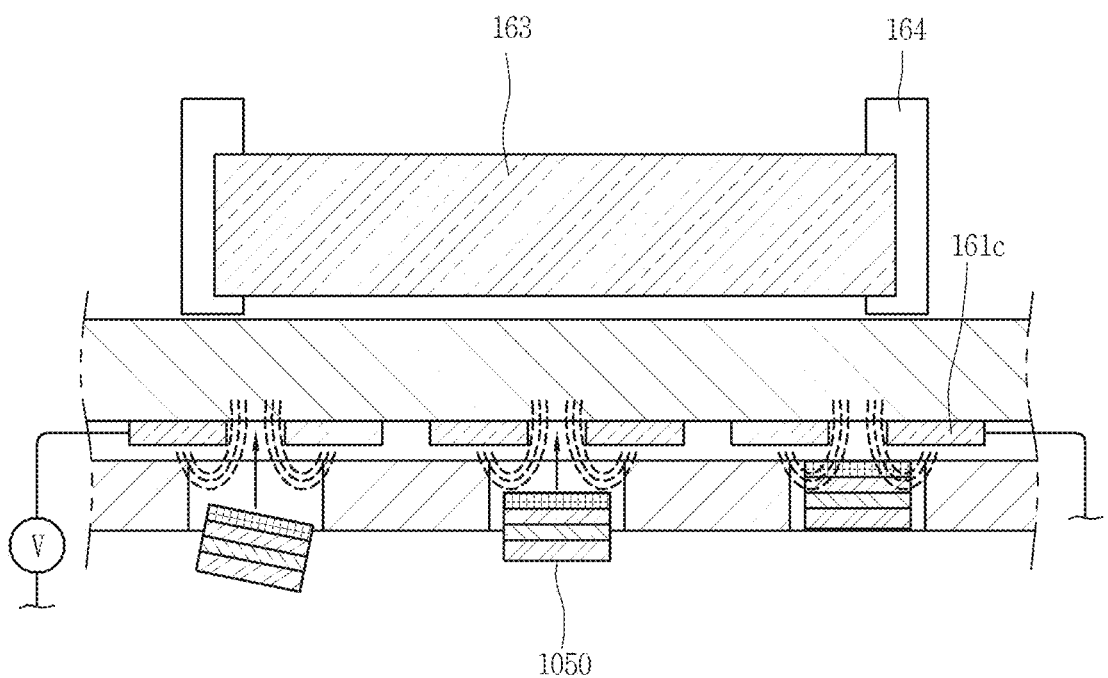
Figure 8E:
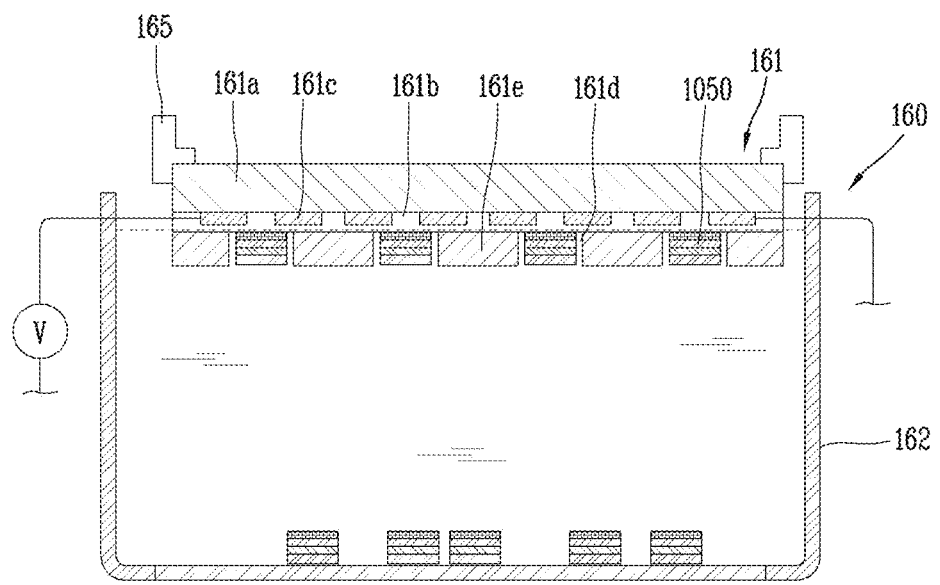

Meanwhile, after the semiconductor light-emitting diodes 1050 are guided to the preset positions, the magnet 163 can be moved in a direction in which it gets farther away from the substrate 161, so that the semiconductor light-emitting diodes 1050 remaining in the assembly chamber 162 fall to the bottom of the assembly chamber 162 (FIG. 8D). In another example, if power supply is stopped in a case where the magnet 163 is an electromagnet, the semiconductor light-emitting diodes 1050 remaining in the assembly chamber 162 fall to the bottom of the assembly chamber 162.

Thereafter, the semiconductor light-emitting diodes 1050 on the bottom of the assembly chamber 162 can be collected, and the collected semiconductor light-emitting diodes 1050 can be re-used.

In the above-described self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

When the self-assembly process described above is performed, several problems occur.

Firstly, as an area of the display increases, an area of the assembly substrate increases. As the area of the assembly substrate increases, there is a problem that a warpage phenomenon of the assembly substrate increases due to a weight of the assembly substrate. When a self-assembly is performed in a state in which the assembly substrate is warped, since the magnetic field at the surface of the assembly substrate is not uniformly formed, it is difficult to perform the self-assembly stably.

Secondly, since the semiconductor light-emitting diodes may not be completely uniformly dispersed in the fluid and the magnetic field formed at the surface of the assembly substrate may not be uniform completely, a problem that the semiconductor light-emitting diodes are concentrated only at a partial region of the assembly substrate can occur.

The present disclosure provides a self-assembly device capable of solving the above-described problems and increasing a self-assembly yield.

The self-assembly device according to the present disclosure can include a substrate surface treatment part, a substrate chuck 200, a magnetic field forming part 300, a chip supply part 400, and an assembly chamber 500. However, the present disclosure is not limited thereto, and the self-assembly device according to the present disclosure can include more or less components than those described above.

Prior to describing the self-assembly device according to the present disclosure, a method for self-assembly using the self-assembly device according to the present disclosure will be described briefly.

Figure 10:
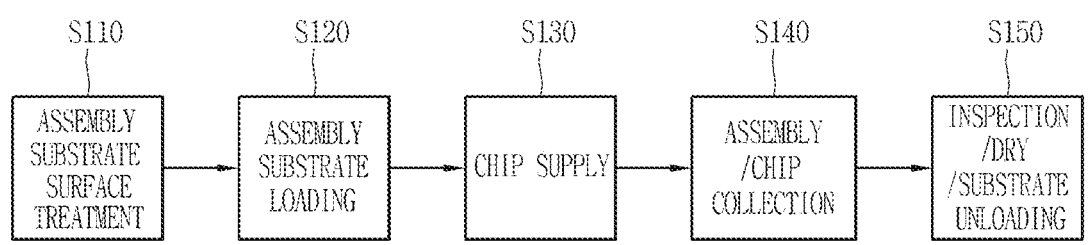
FIG. 10 is a flowchart showing a method for self-assembly according to the present disclosure.

FIG. 10 is a flowchart showing a method for self-assembly according to the present disclosure.

First, a surface treatment step S110 of an assembly substrate is performed. The step is not essential, but when a surface of the substrate is hydrophilized, it is possible to prevent bubbles from being generated on the surface of the substrate.

Next, a step S120 of loading the assembly substrate onto the substrate chuck is performed. The assembly substrate loaded on the substrate chuck 200 is transferred to an assembly position of the assembly chamber. Thereafter, the magnetic field forming part approaches the assembly substrate through vertical and horizontal movements.

In such a state, a step S130 of supplying a chip is performed. Specifically, a step of dispersing the semiconductor light-emitting diode on the assembly surface of the assembly substrate is performed. When the semiconductor light-emitting diode is dispersed near the assembly surface in a state in which the magnetic field forming part 300 is close enough to the assembly substrate, the semiconductor light-emitting diodes adhere to the assembly surface by the magnetic field forming part. The semiconductor light-emitting diodes are dispersed onto the assembly surface at an appropriate dispersion.

However, the present disclosure is not limited thereto, and the semiconductor light-emitting diode can be dispersed into the fluid in the assembly chamber before the substrate is transferred to the assembly position. That is, a time point at which the chip supply step S130 is performed is not limited to after the assembly substrate is transferred to the assembly position.

A method of supplying the semiconductor light-emitting diode can vary according to an area of the assembly substrate, a type of the semiconductor light-emitting diode to be assembled, and a self-assembly speed.

Thereafter, a step S140 of performing the self-assembly and collecting the semiconductor light-emitting diode is performed. The self-assembly will be described later together with a description of a self-assembly device according to the present disclosure. Meanwhile, the semiconductor light-emitting diode is not necessarily collected after the self-assembly. After the self-assembly is completed, the semiconductor light-emitting diode in the assembly chamber is replenished, and then a new substrate can be used to self-assemble the semiconductor light-emitting diode.

Lastly, after the self-assembly is completed, a step S150 of inspecting and drying the assembly substrate, and separating the substrate from the substrate chuck can be performed. The inspection of the assembly substrate can be performed at the position in which the self-assembly has been performed, and can be performed after the assembly substrate is transferred to another position.

Meanwhile, the drying of the assembly substrate can be performed after the assembly substrate is separated from the fluid. After the drying of the assembly substrate, a post process of the self-assembly can be performed.

Contents of a basic principle of the self-assembly, a structure of the substrate (or assembly substrate), and the semiconductor light-emitting diode are replaced with those described in FIGS. 1 to 9. Meanwhile, since a vertical moving part, a horizontal moving part, a rotating part, and other moving means described below can be implemented through several known means such as a motor and a ball screw, a rack gear and a pinion gear, and a pulley and a timing belt, and the like, detailed descriptions thereof will be omitted.

Meanwhile, the controller 172 described in FIG. 7 controls movements of the vertical moving part, the horizontal moving part, the rotating part, and other moving means provided in the above-described components. That is, the controller 172 is configured to control movements of x, y, and z axes and a rotating movement of each component. Even though not mentioned separately in the specification, the movements of the vertical moving part, the horizontal moving part, the rotating part, and other moving means are generated by the control of the controller 172.

Meanwhile, the electrode 161c provided at the substrate (or assembly substrate 161) described in FIGS. 6 to 9 is referred to as an assembly electrode, the assembly electrode 161c is electrically connected to the power supply 171 described in FIG. 7 via the substrate chuck 200, and the power supply 171 supplies power to the assembly electrode 161c by the control of the controller 172. Detailed description thereof will be described later.

Hereinafter, the above-described components will be described.

First, a substrate surface treatment part serves to hydrophilize a substrate surface. Specifically, the self-assembly device according to the present disclosure performs a self-assembly in a state in which the assembly substrate is in contact with a fluid surface. When the assembly surface of the assembly substrate has a heterogeneous property with the fluid surface, bubbles and the like can occur at the assembly surface, and non-specific coupling between the semiconductor light-emitting diode and the assembly surface can occur. To prevent this, the substrate surface can be treated with fluid-friendly properties before the self-assembly.

In one embodiment, when the fluid is a polar material such as water, the substrate surface treatment part can hydrophilize the assembly surface of the substrate.

For example, the substrate surface treatment part can include a plasma generator. Hydrophilic functional groups can be formed at the substrate surface by plasma treatment of the substrate surface. Specifically, the hydrophilic functional groups can be formed at at least one of a partition wall and a dielectric layer provided at the substrate by the plasma treatment.

Meanwhile, different surface treatments can be performed at a partition wall surface and a surface of the dielectric layer exposed to the outside by a cell so as to prevent non-specific coupling of the semiconductor light-emitting diode. For example, a hydrophilic treatment can be performed at the surface of the dielectric layer exposed to the outside by the cell, and a surface treatment can be performed to form hydrophobic functional groups at the surface of the partition wall. Accordingly, non-specific coupling of the semiconductor light-emitting diode with respect to the surface of the partition wall can be prevented, and the semiconductor light-emitting diode can be strongly fixed inside the cell.

However, the substrate surface treatment part is not an essential component in the self-assembly device according to the present disclosure. The substrate surface treatment part may not be necessary depending on a material configuring the substrate.

The substrate at which the surface treatment is completed by the substrate surface treatment part is loaded onto a substrate chuck 200.

Next, the substrate chuck 200 will be described.

Figure 11:
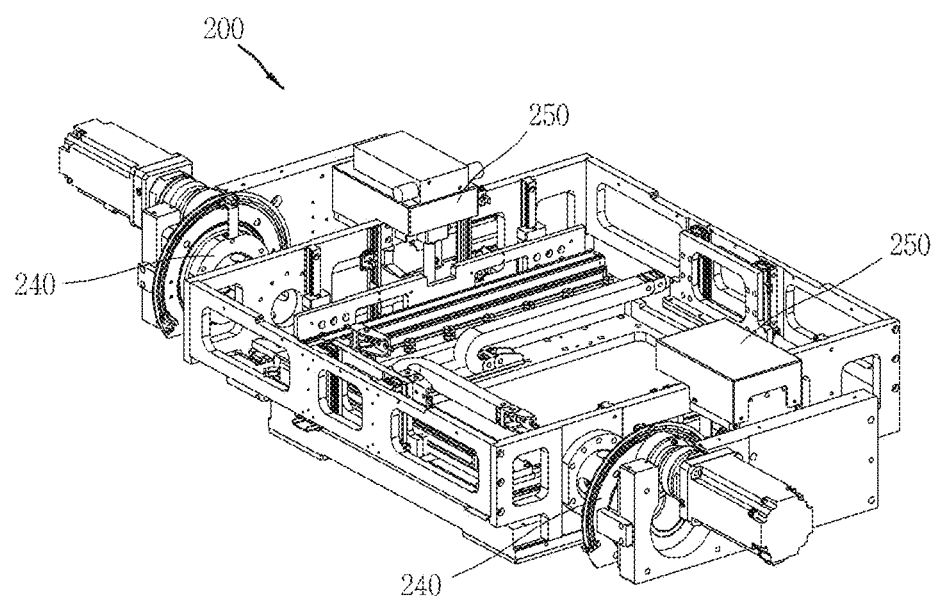
FIG. 11 is a conceptual diagram showing a first state of a substrate chuck.
Figure 12:
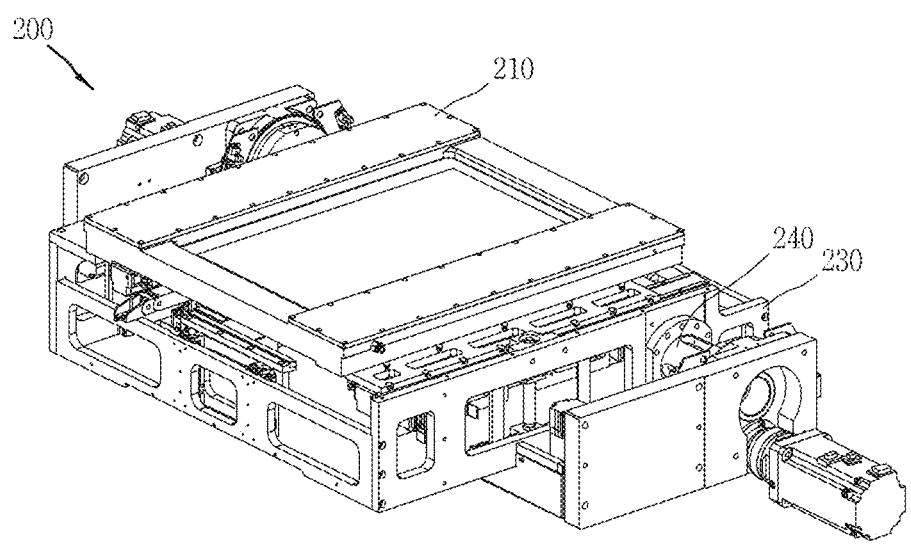
FIG. 12 is a conceptual diagram showing a second state of a substrate chuck.
Figure 13:
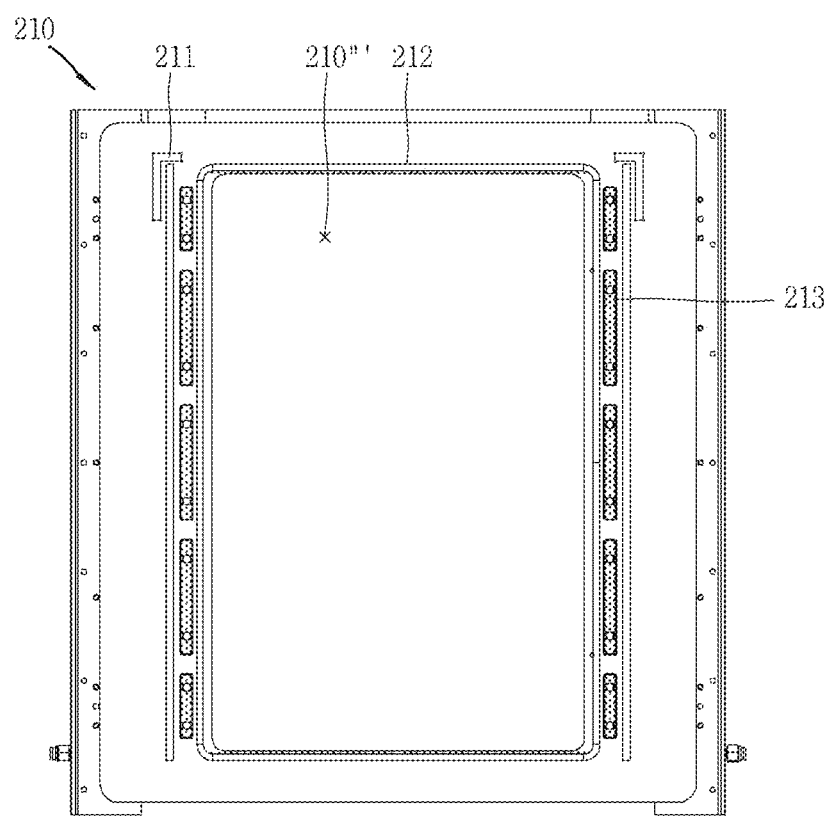
FIG. 13 is a plan view of a first frame provided at a substrate chuck.
Figure 14:
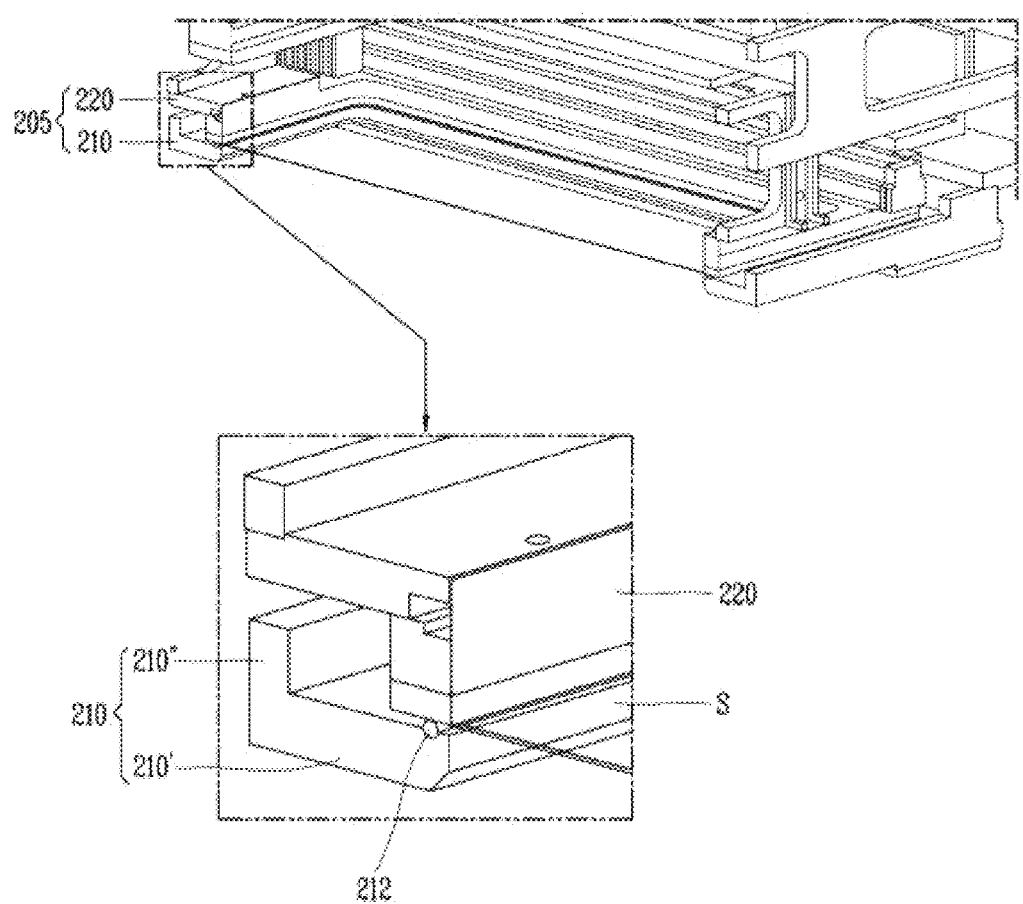
FIG. 14 is a conceptual diagram showing a state in which an assembly substrate is loaded at a substrate chuck.

FIG. 11 is a conceptual diagram showing a first state of a substrate chuck, FIG. 12 is a conceptual diagram showing a second state of the substrate chuck, FIG. 13 is a plan view of a first frame provided at the substrate chuck, and FIG. 14 is a conceptual diagram showing a state in which an assembly substrate is loaded at the substrate chuck.

Referring to the accompanying drawings, the substrate chuck 200 includes a substrate support part (or a substrate support) 205. In one embodiment, the substrate support part 205 can include first and second frames 210 and 220 and a fixing part 230. The first and second frames 210 and 220 are disposed at upper and lower sides of the loaded substrate interposed therebetween, and the fixing part 230 supports the first and second frames 210 and 220. The substrate chuck 200 can include all of a rotating part 240, a vertical moving part (or a vertical mover), and a horizontal moving part (or a horizontal mover). As shown in FIG. 11, the vertical moving part and the horizontal moving part can be formed as one device. Meanwhile, the present disclosure is not limited to drawings described below, and the rotating part, the vertical and horizontal moving parts provided at the substrate chuck can be formed as one device as a moving part 250, but such is not required, and the vertical moving part and the horizontal moving part may can be formed separately.

In the present specification, the first frame 210 is defined as a frame disposed at a lower side of the substrate in a state in which the assembly surface of the substrate S faces a fluid, and the second frame 220 is defined as a frame disposed at a upper side of the substrate in a state in which the assembly surface of the substrate faces the fluid. The upper and lower sides relation between the first frame 210 and the second frame 220 can be switched with each other due to the rotating part 240. In the present specification, a state in which the first frame 210 is under the second frame 220 is defined as a first state (see FIG. 11), and a state in which the first frame 210 is over the second frame 220 is defined as a second state (see FIG. 12). The rotating part 240 rotates at least one of the first and second frames 210 and 220 and the fixing part 230 to switch from any one of the first and second states to the other. The rotating part 240 will be described later.

The first frame 210 is a frame in contact with the fluid filled in the assembly chamber during self-assembly. Referring to FIG. 14, the first frame 210 includes a bottom portion 210' and a sidewall portion 210".

The bottom portion 210' serves to support the substrate at the lower side or the upper side of the substrate S when the substrate S is loaded. The bottom portion 210' can be formed in one plate shape, or can be formed in a form in which a plurality of members forming a plate shape are coupled to each other. Referring to FIG. 13, the bottom portion 210' includes a hole 210''' passing through a central portion. The hole 210''' can expose a substrate which will be described later to the outside to be in contact with the fluid. That is, the hole 210''' defines the assembly surface of the substrate. The substrate is loaded such that four corners of the rectangular substrate are mounted on an edge of the hole 210''' of the first frame 210. Accordingly, a remaining region except the edge of the substrate is overlapped with the hole 210''' provided at the first frame 210. The region of the substrate overlapped with the hole 210''' becomes an assembly surface. Buoyancy (or upthrust), is a force (e.g., upward) exerted by a fluid that opposes the weight of an immersed object, such as the substrate support part 205. In this context, the hole 210''' is an area of the first frame 210 (e.g., of the bottom portion 210') that does not directly support a surface of the substrate S. Accordingly, when the substrate support part 205 is placed on or partially immersed in the fluid, a force is applied (e.g., by the fluid due to pressure difference between air on one side and the fluid on another side of the substrate S) to a portion of the substrate S that is over the hole 210''', the substrate S becomes pushed (or pulled) so that the substrate S goes from a curved state under its own weight (without support or buoyancy from the fluid) to a flat state (or oppositely curved state) due to support or due to a counterforce to the weight from buoyancy or pressure that is difference from that of the fluid.

Meanwhile, a sealing part 212 and an electrode connection part 213 can be disposed at or adjacent the edge of the hole 210''', and can be arranged parallel to the edge of the hole 210'''.

The sealing part 212 is in close contact with the substrate to prevent the fluid filled in the assembly chamber from penetrating into the first and second frames 210 and 220 during self-assembly. In addition, the sealing part 212 prevents the fluid from penetrating into the assembly electrode 161c and the electrode connection part 213. For this, the sealing part 212 should be disposed at a position closer to the hole 210''' than the electrode connection part 213.

The sealing part 212 is formed in a ring shape, and a material of the sealing part 212 is not particularly limited. The material forming the sealing part 212 can be a known sealing material.

The electrode connection part 213 is connected to the assembly electrode formed at the substrate to supply a power to the assembly electrode. In one embodiment, the electrode connection part 213 can apply a power supplied from the power supply 171 described in FIG. 7 to the assembly electrode 161c to form an electric field on the substrate.

Meanwhile, the sidewall portion 210" is formed at an edge of the bottom portion 210'. The sidewall portion 210" prevents the fluid from penetrating into an opposite surface of the assembly surface of the substrate during self-assembly. Specifically, the self-assembly device according to the present disclosure performs self-assembly in a state in which the substrate is submerged in the fluid. The sidewall portion 210" prevents the fluid from penetrating into the opposite surface of the assembly surface of the substrate when the substrate is submerged in the fluid.

For this, the sidewall portion 210" is formed to surround an entire edge of the substrate. A height of the sidewall portion 210" should be greater than a depth at which the substrate is submerged in the fluid. The sidewall portion 210" prevents the fluid from penetrating into the opposite surface of the assembly surface of the substrate, and thus the substrate is prevented from being damaged, and buoyancy of the fluid is applied to only one surface of the substrate. This will be described later.

Meanwhile, the second frame 220 serves to press the substrate at the opposite side of the first frame 210 during self-assembly. Like the first frame 210, the second frame 220 includes a hole passing through a central portion. The hole formed at the second frame 220 is formed to have a size equal to or larger than the hole 210''' formed at the first frame 210.

The hole formed at the second frame 220 allows the opposite surface of the assembly surface of the substrate to be exposed to the outside. The opposite surface of the assembly surface of the substrate should be exposed to the outside in the same area as the assembly surface or in a larger area than the assembly surface. This is because the magnetic field forming part 300 forms a magnetic field at the opposite side of the assembly surface of the substrate. The opposite surface of the assembly surface of the substrate should be exposed to the outside such that the magnetic field forming part 300 can sufficiently approach the substrate.

Meanwhile, the substrate S is loaded between the first and second frames 210 and 220 in the second state. Accordingly, the substrate S is slid and loaded at one surface of the second frame 220. A protrusion for guiding an alignment position of the substrate can be formed at at least one of the first and second frames such that the substrate is aligned to a correct position. In one embodiment, referring to FIG. 13, a protrusion 211 guiding the alignment position of the substrate S can be formed at the first frame 210.

Meanwhile, when the substrate S is loaded on the second frame 220, at least one of the first and second frames 210 and 220 moves vertically such that the first and second frames 210 and 220 press the substrate. For this, the substrate chuck 200 can include a frame moving part disposed at at least one of the fixing part 230, and the first and the second frames 210 and 220. At this time, the sealing part 212 presses the substrate S.

In one embodiment, a frame moving part for vertically moving the second frame 220 can be disposed at the fixing part 230. While the substrate chuck is in the second state, when the substrate S is loaded on the second frame 220, the vertical moving part moves the second frame 220 upwardly such that the substrate S can be strongly fixed between the first and second frames 210 and 220. At this time, the electrode connection part 213 provided at the first frame 210 is connected to the assembly electrode of the substrate S, and the sealing part 212 provided at the first frame 210 presses the edge of the substrate S. In this state, when the substrate chuck switches to the first state, the substrate chuck has a shape as shown in FIG. 14.

However, the present disclosure is not limited thereto, and the frame moving part can be formed so as to move any one of the first and second frames 210 and 220 horizontally with respect to the other. In this case, the frame moving part is formed so as to move any one of the first and second frames 210 and 220 vertically and horizontally with respect to the other. When any one of the first and second frames 210 and 220 can be moved horizontally with respect to the other, a connection part between the electrode connection part 213 and the assembly electrode can be changed. It can be used to detect whether the assembled electrode is defective.

Meanwhile, the rotating part 240 is disposed at one side of the fixing part 230 provided at the substrate chuck 200 described above. The rotating part 240 rotates the fixing part 230 such that the upper and lower-sides relation of the first and second frames 210 and 220 can be switched to each other. The substrate chuck 200 is switched from any one of the first and second states to the other by rotating movement of the rotating part 240. A rotation speed, a degree of rotation, a rotation direction, and the like of the rotating part 240 can be controlled by the controller 172 described in FIG. 7.

In one embodiment, the substrate chuck 200 is in the second state before the substrate S is loaded, and the controller 172 controls the rotating part 240 to rotate the fixing part 230 to 180 degrees after the substrate S is loaded such that the substrate chuck 200 is switched to the first state.

Meanwhile, a vertical moving part and a horizontal moving part are disposed at one side of the fixing part 230.

The horizontal moving part moves at least one of the fixing part 230, and the first and second frames 210 and 220 such that the assembly surface of the substrate can be aligned at an open position of the assembly chamber after the substrate is loaded.

The vertical moving part moves at least one of the fixing part 230, and the first and second frames 210 and 220 such that the vertical distance between the substrate and the assembly chamber is adjusted. A warpage phenomenon of the substrate S can be corrected or compensated by the vertical moving part using the buoyancy. This will be described later.

In summary, the substrate S is loaded in the second state of the substrate chuck 200 (see FIG. 12). Thereafter, the substrate chuck 200 is switched to the first state (see FIG. 11) and then aligned with the assembly chamber. In this process, the substrate chuck 200 moves vertically and horizontally such that the assembly surface of the substrate S is in contact with the fluid filled in the assembly chamber. Thereafter, the controller 172 controls the magnetic field forming part 300.

Next, the magnetic field forming part 300 will be described.

Figure 15:
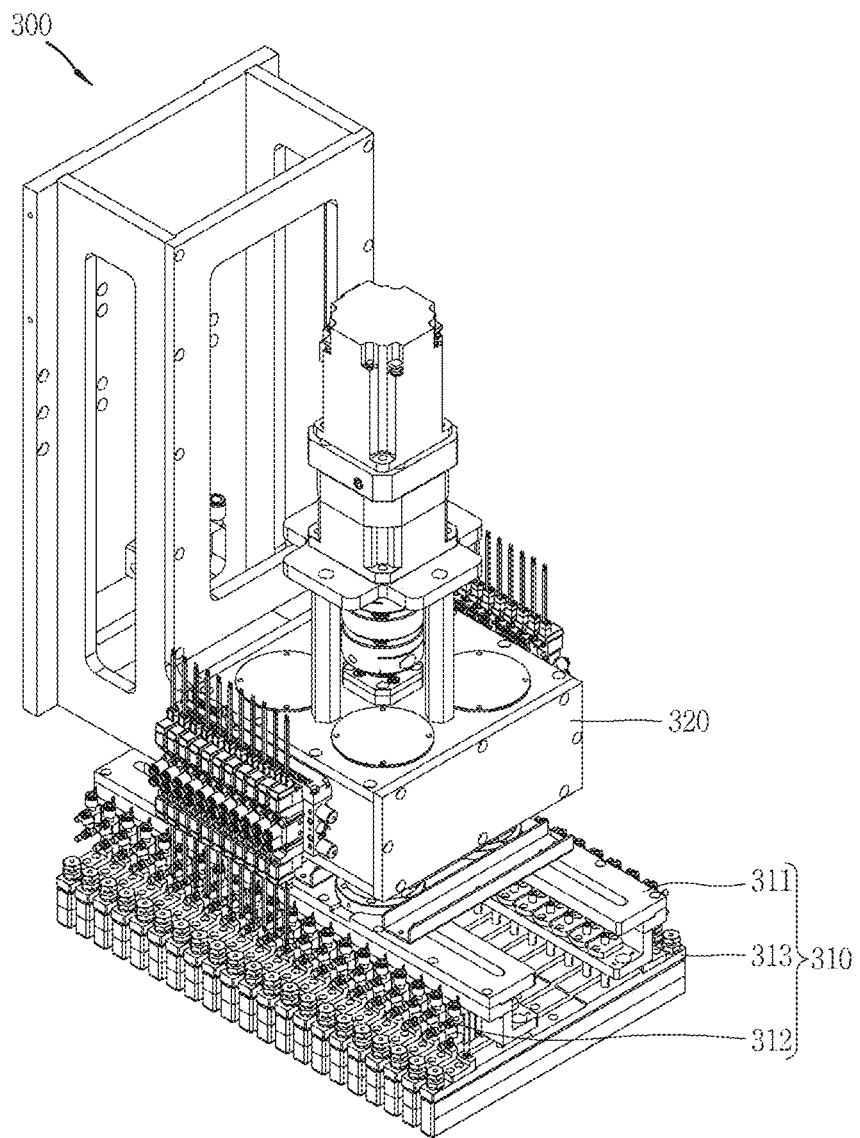
FIG. 15 is a perspective view of a magnetic field forming part according to one embodiment of the present disclosure.
Figure 16:
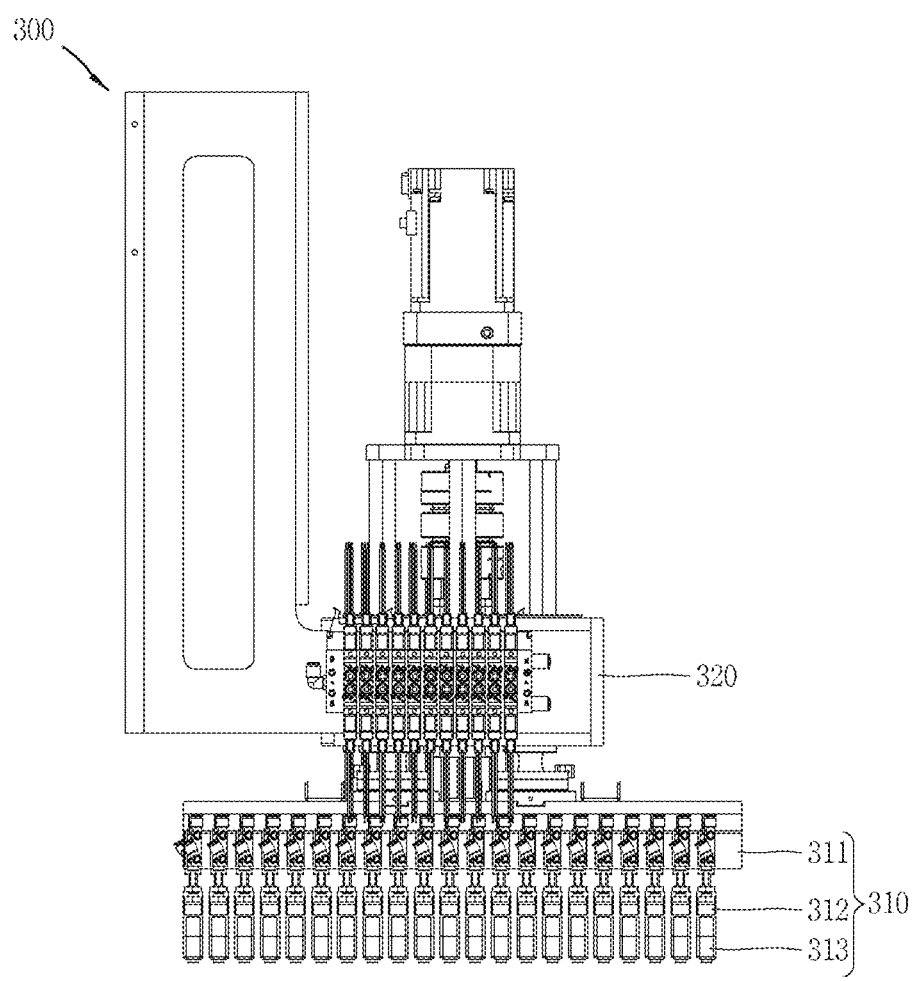
FIG. 16 is one side view of a magnetic field forming part according to one embodiment of the present disclosure.
Figure 17:
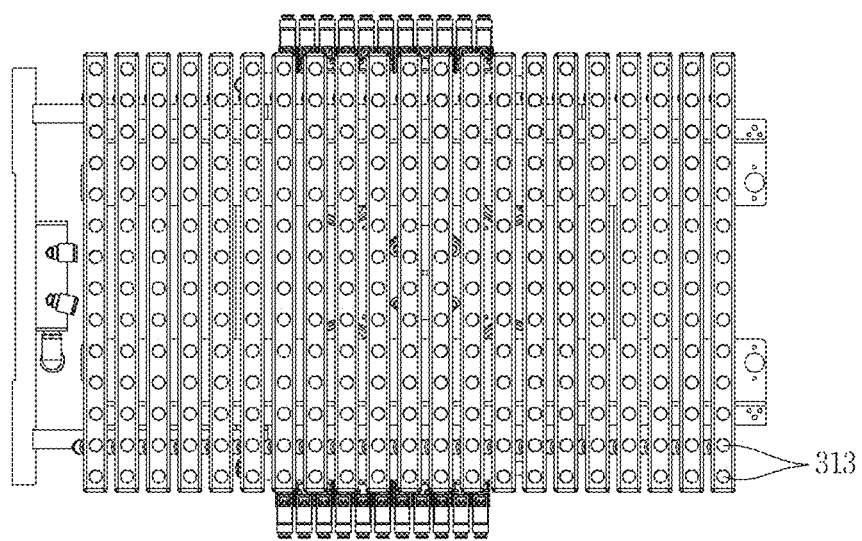
FIG. 17 is a lower side view of a magnetic field forming part according to one embodiment of the present disclosure.
Figure 18:
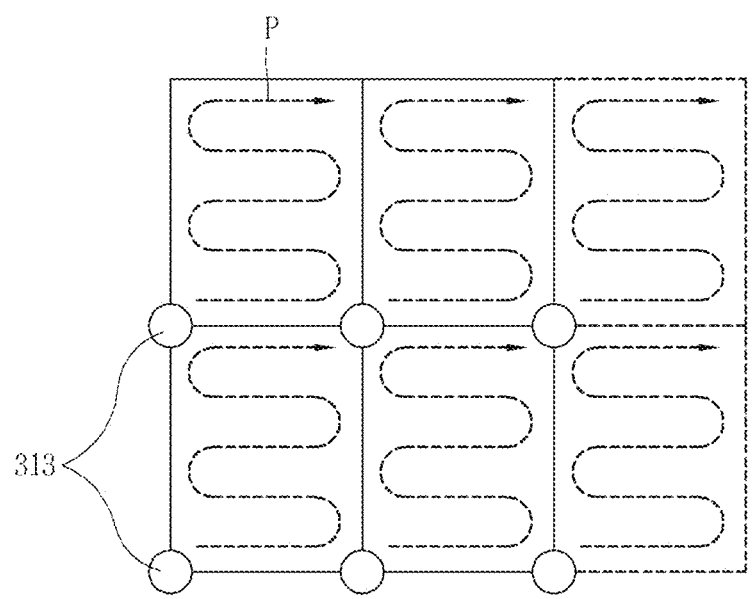
FIG. 18 is a conceptual diagram showing a trajectory of magnets provided at the magnetic field forming part according to the present disclosure.

FIG. 15 is a perspective view of a magnetic field forming part according to one embodiment of the present disclosure, FIG. 16 is one side view of a magnetic field forming part according to one embodiment of the present disclosure, FIG. 17 is a bottom side view of a magnetic field forming part according to one embodiment of the present disclosure, and FIG. 18 is a conceptual diagram showing a trajectory of magnets provided at a magnetic field forming part according to the present disclosure.

Referring to the drawings, the magnetic field forming part 300 includes a magnet array 310, a vertical moving part 320, a horizontal moving part 320, and a rotating part 320. The magnetic field forming part 300 is disposed at an upper side of the assembly electrode to serve to form a magnetic field.

Specifically, the magnet array 310 includes a plurality of magnets 313. The magnet 313 provided at the magnet array 310 can be a permanent magnet or an electromagnet. The magnets 313 serves to form a magnetic field so that the semiconductor light-emitting diodes are led to the assembly surface of the substrate.

The magnet array 310 can include a support part 311 and a magnet moving part 312. The support part 311 is connected to parts 320 that can include a vertical moving part, a horizontal moving part, and a rotating part.

Meanwhile, one end of the magnet moving part 312 is fixed to the support part 311, and the magnet 313 is fixed to the other end of the magnet moving part 312. The magnet moving part 312 is formed to be stretchable in length, and as the magnet moving part 312 is stretched, a distance between the magnet 313 and the support part 311 changes.

As shown in the accompanying drawings, the magnet moving part 312 can be configured to vertically move the magnets 313 disposed in one row at a time. In this case, the magnet moving part 312 can be disposed for each column of the magnet array.

On the other hand, the magnet moving part 312 can be disposed by the number of magnets provided in the magnet array. Accordingly, a distance between each of a plurality of magnets and the support part can be adjusted differently.

The plurality of magnet moving parts serves to adjust finely a gap between the magnet 313 and the substrate S, and when the substrate is warped, serves to adjust uniformly the gaps between the magnets 313 and the substrate S. Self-assembly can be performed in a state in which the magnet 313 is in contact with the substrate S, or can be performed in a state in which the magnet 313 is spaced apart from the substrate S at a predetermined distance.

Meanwhile, the horizontal moving part can include a rotating part. When the self-assembly is performed, the horizontal moving part provided at the magnetic field forming part 300 moves the magnet in one direction and rotates the magnet, simultaneously. Accordingly, the magnet array 310 rotates with respect to a predetermined rotation axis and moves along one direction, simultaneously. For example, referring to FIG. 18, the magnet 313 provided at the magnet array 310 can move while drawing a trajectory P mixed with a curved line and a straight line.

The semiconductor light-emitting diode can be supplied in a state in which the magnetic field forming part 300 is close to the substrate S within a predetermined distance.

Figure 19:
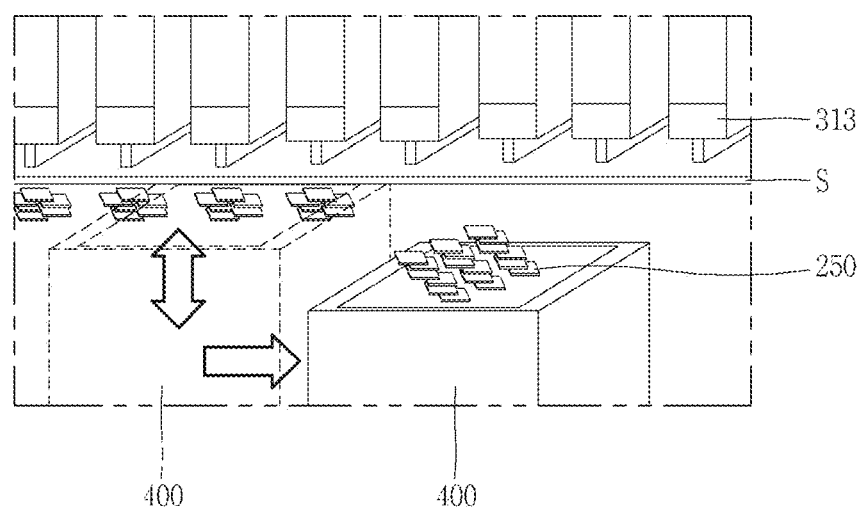
FIG. 19 is a conceptual diagram showing a state in which a semiconductor light-emitting diode is supplied.

FIG. 19 is a conceptual diagram showing a state in which a semiconductor light-emitting diode is supplied.

Referring to FIG. 19, a chip supply part 400 can be disposed in an assembly chamber 500 to be described later. The substrate S is aligned with the assembly chamber 500, and then the chip supply part 400 serves to supply the semiconductor light-emitting diode to the assembly surface of the substrate S. Specifically, the chip supply part 400 can include a chip accommodating part that can accommodate a chip at an upper portion thereof, a vertical moving part, and a horizontal moving part. The vertical and horizontal moving parts allow the chip accommodating part to move in the fluid filled in the assembly chamber.

The plurality of semiconductor light-emitting diodes can be loaded at the chip accommodating part. After the substrate is aligned with the assembly chamber, when the magnetic field forming part 300 is brought close to the substrate within a predetermined distance, a magnetic field of a predetermined intensity or more is formed on the assembly surface. In this state, when the chip accommodating part is brought close to the assembly surface within the predetermined distance, the semiconductor light-emitting diodes loaded at the chip accommodating part are in contact with the substrate. The vertical moving part provided at the chip supply part brings the chip accommodating part close to a partial region of the assembly surface of the substrate within the predetermined distance through vertical movement.

After a predetermined time passes, the vertical moving part provided at the chip supply part allows the chip accommodating part to be separated from the partial region of the assembly surface of the substrate at the predetermined distance or longer through vertical movement. Thereafter, the horizontal moving part provided at the chip supply part moves horizontally the chip accommodating part such that the chip accommodating part is overlapped with a different region from the partial region of the assembly surface.

Thereafter, the vertical moving part provided at the chip supply part brings the chip accommodating part close to the different region within the predetermined distance through vertical movement. By repeating such a process, the chip supply part brings the plurality of semiconductor light-emitting diodes into contact with an entire region of the assembly surface of the substrate. Self-assembly can be performed in a state in which the plurality of semiconductor light-emitting diodes are constantly dispersed and in contact with the entire region of the assembly surface of the substrate.

As described above, there are largely two problems in self-assembly. A second problem is that since the semiconductor light-emitting diodes may not be completely uniformly dispersed in the fluid and the magnetic field formed at the surface of the assembly substrate may not be perfectly uniform, there is a problem that the semiconductor light-emitting diodes are concentrated only at a partial region of the assembly substrate. When using the chip supply part 400 described above, it is possible to solve the second problem described above.

However, the present disclosure is not limited thereto, and the chip supply part is not an essential component of the present disclosure. Self-assembly can be performed in a state in which the semiconductor light-emitting diode is dispersed in the fluid, or in a state in which the plurality of semiconductor light-emitting diodes are dispersed and in contact with the assembly surface of the substrate by another part which is not the chip supply part.

Next, the assembly chamber 500 will be described.

Figure 20:
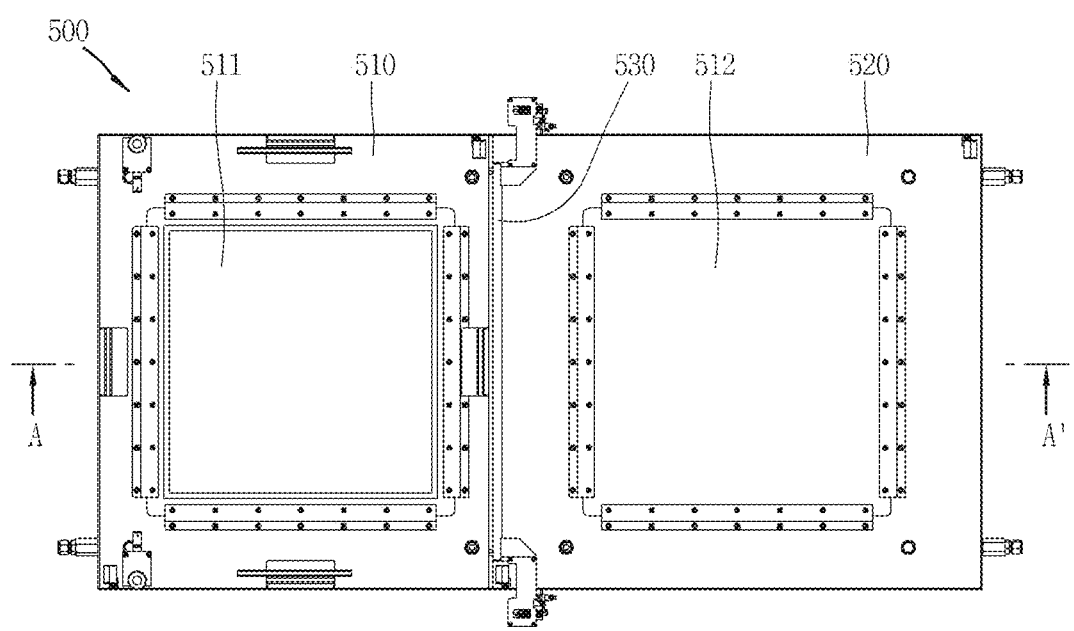
FIG. 20 is a plan view of an assembly chamber according to one embodiment of the present disclosure.
Figure 21:
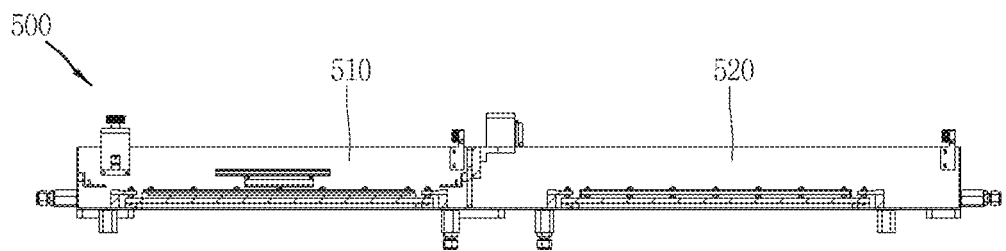
FIG. 21 is a cross-sectional view taken along line A-A' of FIG. 20.
Figure 22:
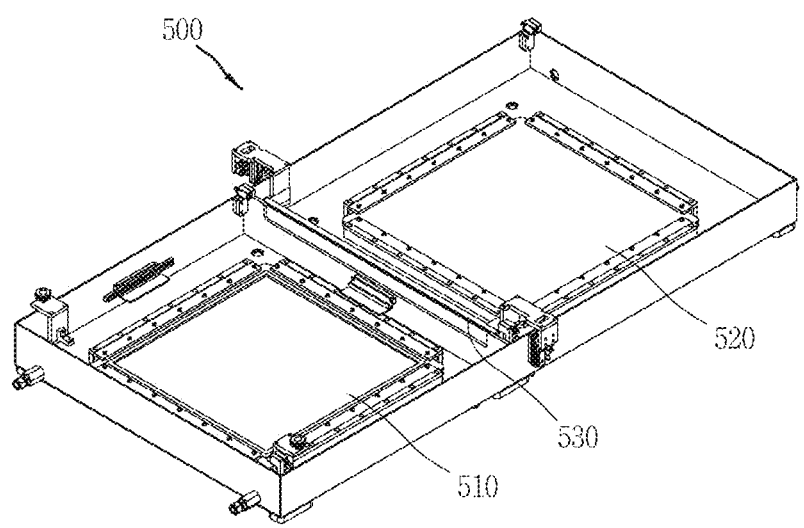
FIGS. 22 and 23 are conceptual views showing movement of a gate provided at an assembly chamber according to one embodiment of the present disclosure.
Figure 23:
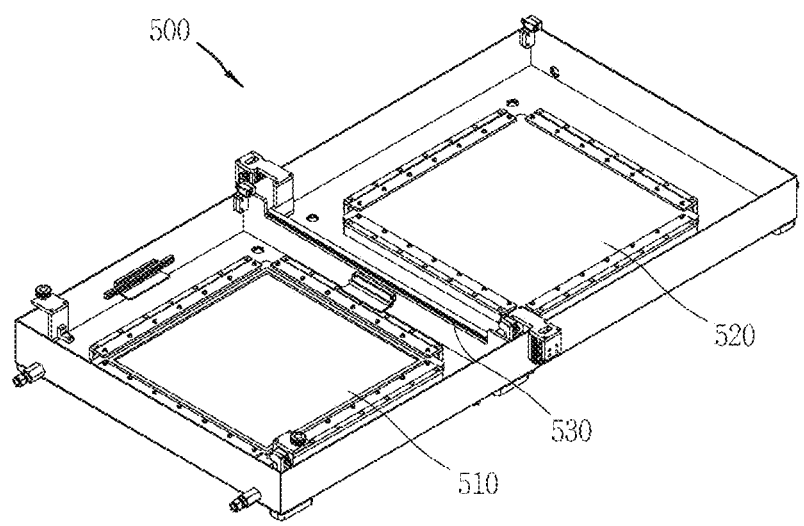

FIG. 20 is a plan view of an assembly chamber according to one embodiment of the present disclosure, FIG. 21 is a cross-sectional view taken along line A-A' of FIG. 20, and FIGS. 22 and 23 are conceptual diagrams showing a movement of a gate provided at an assembly chamber according to one embodiment of the present disclosure.

The assembly chamber 500 includes a space for accommodating a plurality of semiconductor light-emitting diodes. The space can be filled with a fluid, and the fluid can include water, and the like as an assembly solution. Therefore, the assembly chamber 500 can be a water tank, and can be configured as an open type. However, the present disclosure is not limited thereto, and the space of the assembly chamber 500 can be a closed type formed in a closed space.

In the assembly chamber 500, a substrate S is disposed such that an assembly surface at which the semiconductor light-emitting diodes 150 are assembled is faced downwardly. For example, the substrate S is transferred to an assembly position by the substrate chuck 200.

At this time, the assembly surface of the substrate S at the assembly position faces a bottom of the assembly chamber 500. Accordingly, the assembly surface is toward a direction of gravity. The assembly surface of the substrate S is disposed to be submerged in the fluid in the assembly chamber 500.

In one embodiment, the assembly chamber 500 can be divided into two regions. Specifically, the assembly chamber 500 can be divided into an assembly region 510 and an inspection region 520. In the assembly region 510, the semiconductor light-emitting diode disposed in the fluid is assembled to the substrate S in a state in which the substrate S is submerged in the fluid.

On the other hand, in the inspection region 520, the substrate S that has been self-assembled is inspected. Specifically, the substrate S is assembled at the assembly region and then transferred to the inspection region via the substrate chuck.

The same fluid can be filled in the assembly region 510 and the inspection region 520. The substrate can be transferred from the assembly region to the inspection region in a state in which the substrate is submerged in the fluid. When the substrate S disposed in the assembly region 510 is taken out of the fluid, the previously assembled semiconductor light-emitting diode can be separated from the substrate due to surface energy between the fluid and the semiconductor light-emitting diode. For this reason, it is preferable that the substrate is transferred in a state of being submerged in the fluid.

The assembly chamber 500 can include a gate 530 configured to be capable of moving up and down such that the substrate can be transferred in a state of being submerged in the fluid. As shown in FIG. 22, the gate 530 maintains an elevated state (first state) during self-assembly or during substrate inspection, so that the fluid accommodated in the assembly region 510 and the inspection region 520 of the assembly chamber 500 is separated from each other. The gate 530 separates the assembly region and the inspection region, thereby preventing disturbing the inspection of the substrate due to moving of the semiconductor light-emitting diode to the inspection region during self-assembly.

As shown in FIG. 23, when the substrate S is transferred, the gate 530 moves down (second state) to remove a boundary between the assembly region 510 and the inspection region 520. Accordingly, the substrate chuck 200 can transfer the substrate from the assembly region 510 to the inspection region 520 by only horizontal movement without separate vertical movement.

Meanwhile, a sonic generator for preventing agglomeration of the semiconductor light-emitting diode can be disposed at the assembly region 510. The sonic generator can prevent the plurality of semiconductor light-emitting diodes from agglomerating with each other by vibration.

Meanwhile, bottom surfaces of the assembly region 510 and the inspection region 520 can be made of a light transmissive material. In one embodiment, referring to FIG. 20, light transmission regions 511 and 512 can be provided at the bottom surfaces of the assembly region 510 and the inspection region 520, respectively. Accordingly, the present disclosure enables to monitor the substrate during self-assembly, or to perform inspection with respect to the substrate. It is preferable that an area of the light transmission region is larger than that of the assembly surface of the substrate. However, the present disclosure is not limited thereto, and the assembly chamber can be configured to perform self-assembly and inspection at the same position.

When using the substrate chuck 200, the magnetic field forming part 300, and the assembly chamber 500 as described above, the self-assembly described in FIGS. 8A to 8E can be performed. Hereinafter, a detailed structure and method for solving problems caused during self-assembly will be described in detail.

First, a structure and method for solving the most critical problem that occurs during self-assembly will be described. When describing the problem in detail, as an area of a display increases, an area of an assembly substrate increases, and as the area of the assembly substrate increases, a problem that a warpage phenomenon of the substrate increases occurs. When performing self-assembly in a state in which the assembly substrate is warped, since a magnetic field is not uniformly formed or applied at a surface of the assembly substrate, it is difficult to perform the self-assembly stably.

Figure 24:
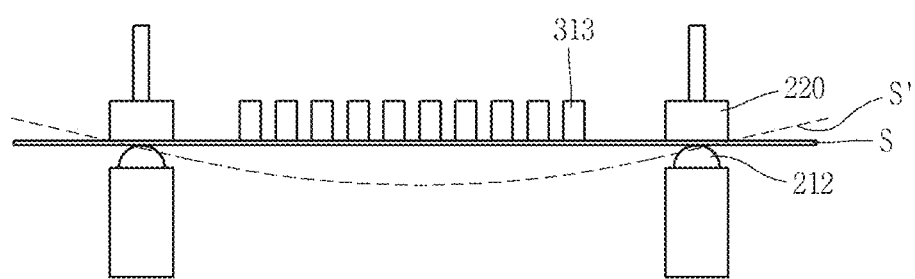
FIG. 24 is a conceptual diagram showing a warpage phenomenon of a substrate generated during self-assembly.

FIG. 24 is a conceptual diagram showing a substrate warpage phenomenon caused during self-assembly.

Referring to FIG. 24, when a substrate S maintains a flat state during self-assembly, a distance between a plurality of magnets 313 and the substrate S can be uniform. In this case, a magnetic field can be formed uniformly at an assembly surface of the substrate. However, when the substrate is actually loaded onto the substrate chuck 200, the substrate is warped due to gravity. In a warped substrate S', since a distance between the plurality of magnets 313 and the substrate S' is not constant, uniform self-assembly is difficult. Since a magnetic field forming part is disposed on an upper side of the substrate, a separate instrument for correcting the warpage phenomenon of the substrate is difficult to be disposed on the upper side of the substrate. In addition, when the separate instrument for correcting the warpage phenomenon of the substrate is disposed on a lower side the substrate, movement of the semiconductor light-emitting diodes can be restricted, and there is a problem that the instrument covers a part of the assembly surface. For this reason, it is difficult to dispose the instrument for correcting the warpage phenomenon of the substrate either on the upper side or the lower side of the substrate.

The present disclosure provides a structure and method of a substrate chuck for correcting a warpage phenomenon of the substrate.

Figure 25:
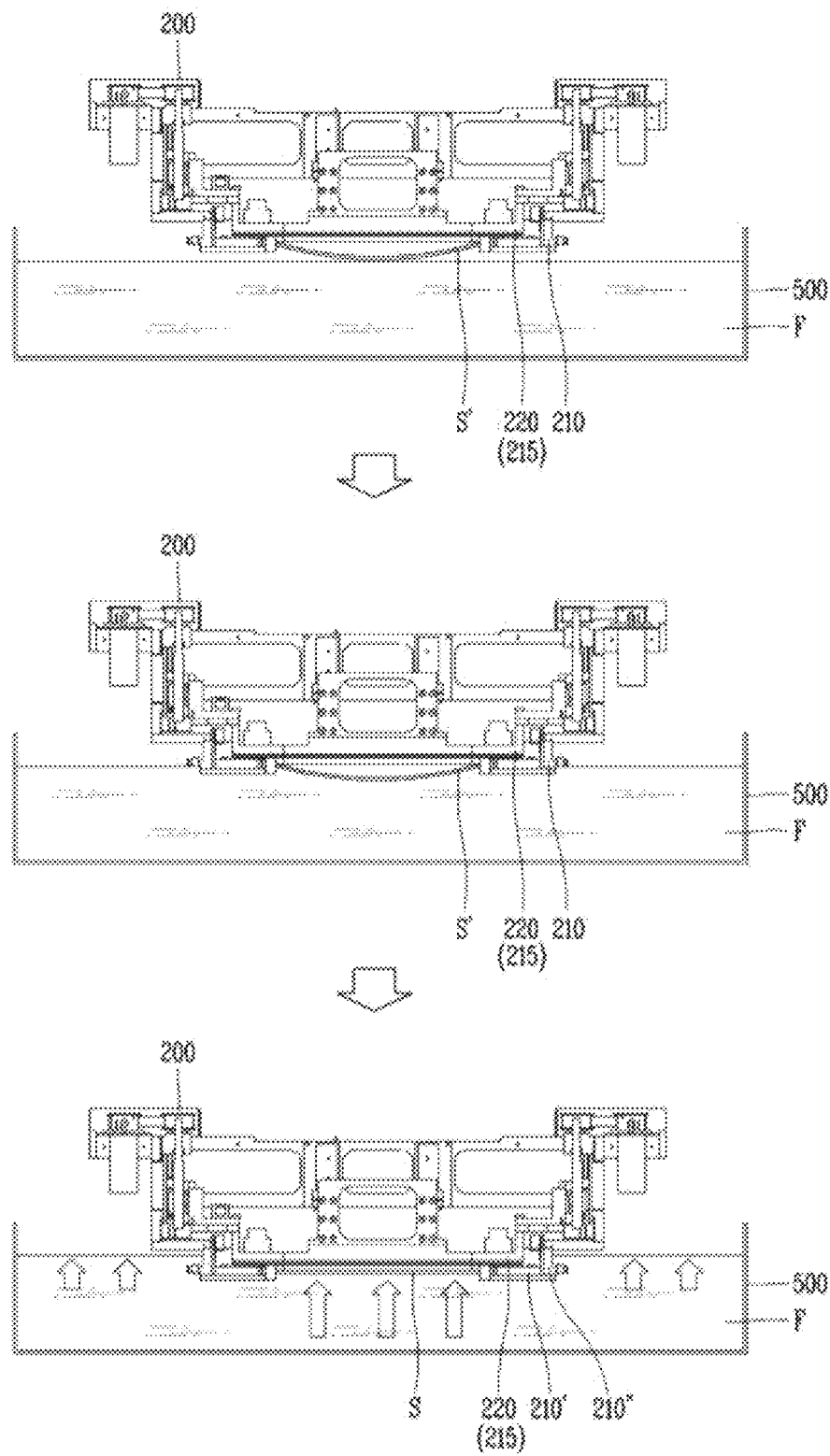
FIG. 25 is a conceptual diagram showing a method for correcting a warpage phenomenon of a substrate.

FIG. 25 is a conceptual diagram showing a method for correcting a warpage phenomenon of a substrate.

Referring to FIG. 25, after loading a substrate S' at a substrate chuck 200, when an assembly surface of the substrate faces the gravity direction, the substrate S' is warped. In order to minimize warping of the substrate when loading the substrate, at least one of first and second frames 210 and 220 provided at the substrate chuck applies pressure to all four corners of a rectangular substrate. Nevertheless, when the area of the substrate S' is increased, the substrate is inevitably warped due to gravity.

As shown in the second drawing of FIG. 25, after the substrate chuck 200 is moved to an assembly position, when the substrate chuck 200 is moved down at a predetermined distance, the substrate S' brings into contact with a fluid F. In a state in which the substrate S' is simply in contact with the fluid F, the warpage phenomenon of the substrate S' is not corrected. Although self-assembly can be performed in a state as shown in the second drawing of FIG. 25, it is difficult to perform uniform self-assembly.

The present disclosure further moves down the substrate chuck 200 in the state in which the substrate S' is in contact with the fluid F in order to correct the warpage phenomenon of the substrate. At this time, a sealing part 212 provided at the first frame 210 prevents the fluid F from penetrating into a window of the first frame. In addition, a sidewall portion 210" provided at the first frame 210 prevents the fluid F from flowing over the first frame to an opposite surface of the assembly surface of the substrate S'.

Here, the sealing part 212 should be formed to surround all edges of the substrate. In addition, a height of the sidewall portion 210" should be greater than a depth at which the first frame 210 is moved down to the maximum based on a state in which the first frame 210 is in contact with the fluid F. That is, when the substrate chuck 200 moves down, the fluid should not penetrate over the window and the sidewall portion 210" of the first frame 210.

When the substrate chuck 200 moves down, a surface of the fluid F is raised due to the sealing part 212 and the sidewall portion 210" as described above. At this time, buoyancy by the fluid F acts on the substrate S'. As the surface rising width of the fluid F increases, the buoyancy acting on the substrate S' increases.

In the present disclosure, the buoyancy (and thereby an amount of force) acting on the substrate can be changed by measuring or determining a degree of warping of the substrate S' and adjusting a descending width of the substrate chuck 200 according to the degree of warping of the substrate. When an appropriate buoyancy is applied to the substrate, as shown in the third drawing of FIG. 25, the substrate S is maintained in a flat state.

The magnetic field forming part 300 is transferred to the upper side of the substrate S in a state in which buoyancy is applied to the substrate S, and then moves horizontally along the substrate S. At this time, power of the power supply 171 is applied to the assembly electrode 161*c* via the electrode connection part 213. That is, self-assembly proceeds in a state in which buoyancy is applied to the assembly surface of the substrate S.

According to the above description, it is not necessary to dispose separate structures at the upper and lower sides of the substrate, and the warpage phenomenon of the substrate can be corrected. Accordingly, even when an area of the assembly substrate is increased, the present disclosure enables to achieve a high self-assembly yield.

The present disclosure relates to a chip supply part 1000 for supplying semiconductor light-emitting diodes to a substrate S among configurations of the above-described device for self-assembling semiconductor light-emitting diodes.

Figure 26:
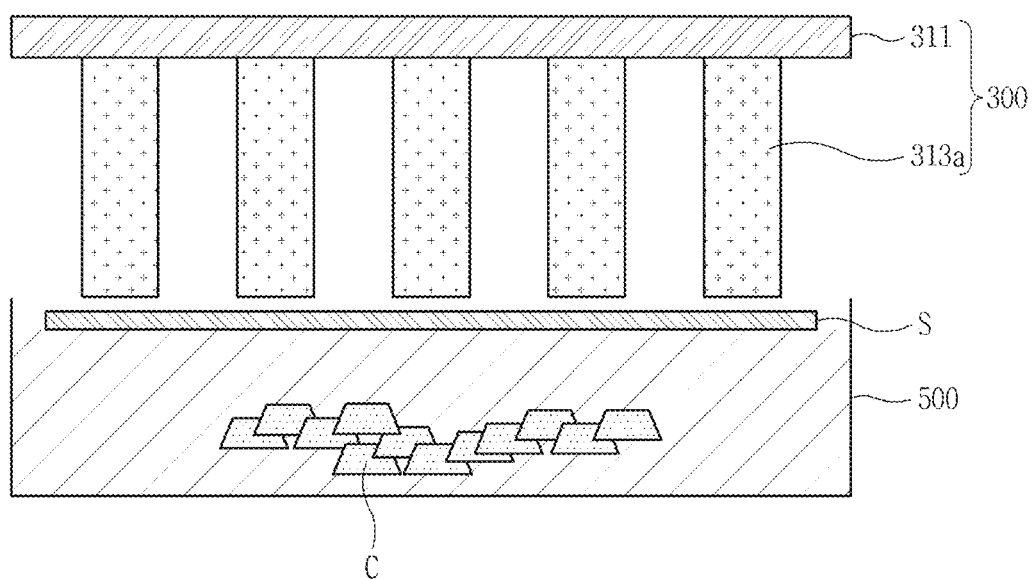
FIG. 26 is a conceptual diagram showing a conventional method of supplying a semiconductor light-emitting diode.

FIG. 26 is a conceptual diagram showing a conventional method of supplying a semiconductor light-emitting diode. In the related art, a self-assembly process was performed after a large amount of semiconductor light-emitting diodes C for self-assembly was randomly supplied to a fluid in an assembly chamber 500 as shown in FIG. 26.

A part of the semiconductor light-emitting diodes C supplied in the fluid was loaded onto individual magnets 313 forming a magnet array 313*a* provided at an upper side of the substrate S, and placed in predetermined positions of the substrate S. The other semiconductor light-emitting diodes C which were not loaded onto the individual magnets 313 remained in the fluid during self-assembly, and were collected together with the semiconductor light-emitting diodes C that sank as the magnet arrays 313*a* moved away from the substrate S after self-assembly was completed.

However, there was a problem that the semiconductor light-emitting diodes C supplied by such a method were nonuniformly distributed in the fluid, so that the semiconductor light-emitting diodes C were not uniformly loaded onto the individual magnets 313 forming the magnet array 313*a*.

Accordingly, a time required for assembly per unit area was different for each position of the individual magnets 313, which causes an increase in a tack time of the self-assembly process.

A self-assembly device according to the present disclosure includes a chip supply part 1000 capable of uniformly supplying semiconductor light-emitting diodes C to an assembly surface of a substrate S. Hereinafter, the chip supply part 1000, which is one configuration of the self-assembly device according to an embodiment of the present disclosure, will be described in detail.

Figure 27:
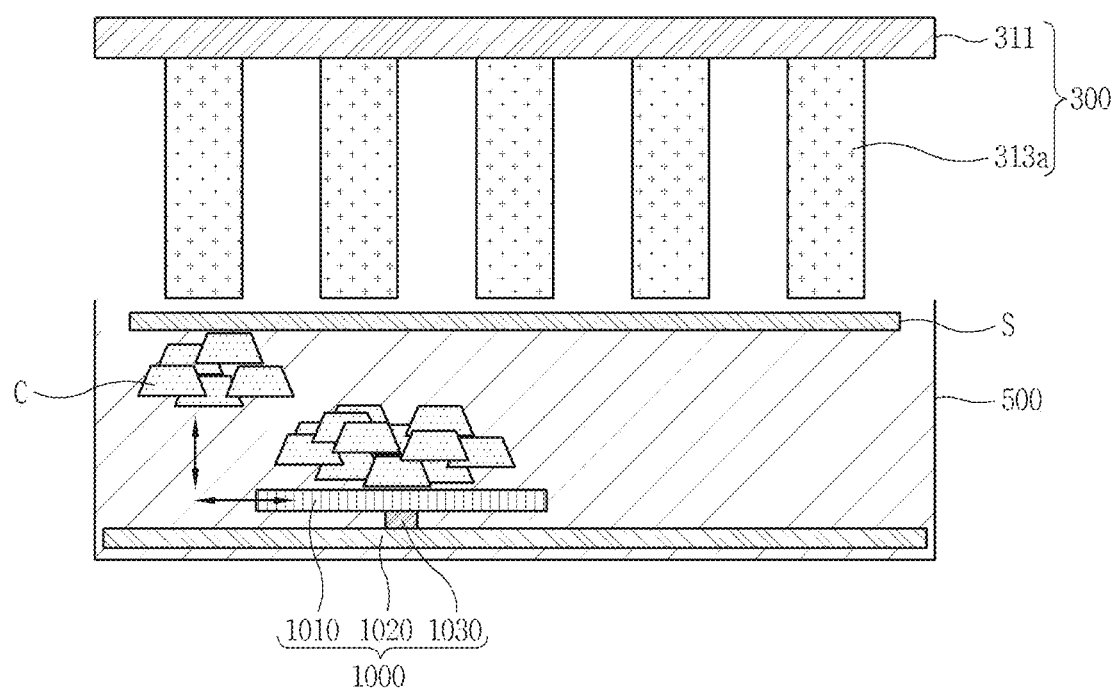
FIG. 27 is a conceptual diagram showing a method of supplying a semiconductor light-emitting diode via a chip supply part according to an embodiment of the present disclosure.
Figure 28:
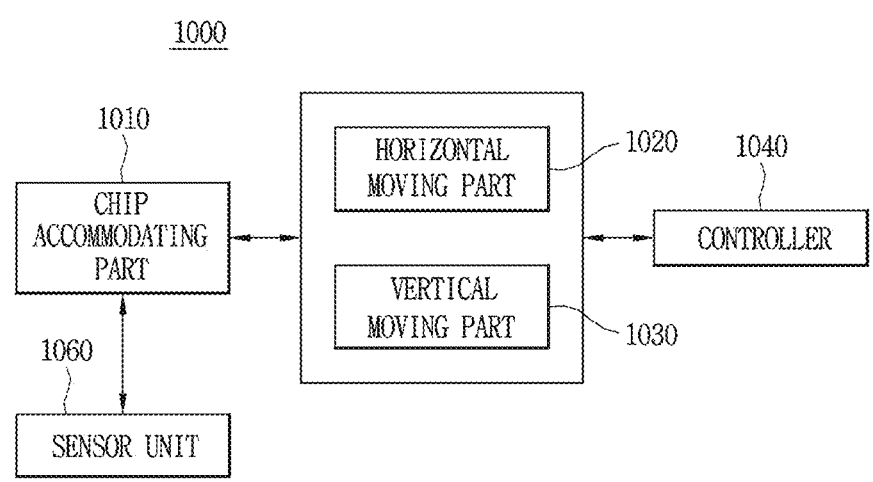
FIG. 28 is a block diagram of configurations of a chip supply part according to an embodiment of the present disclosure.
Figure 29:
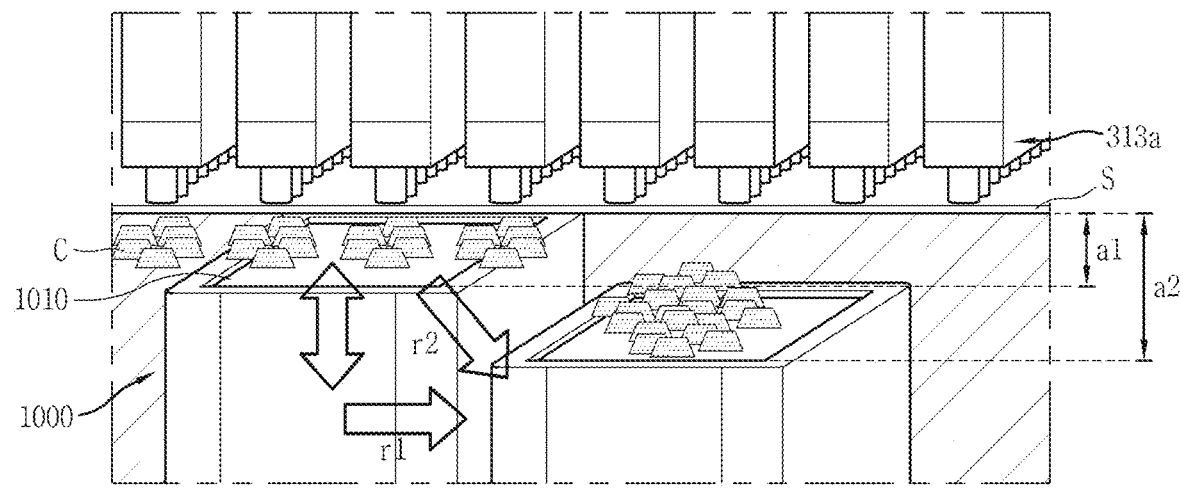
FIG. 29 is an enlarged view showing a method of supplying a semiconductor light-emitting diode to a substrate via a chip supply part according to an embodiment of the present disclosure.

FIG. 27 is a conceptual diagram showing a method of supplying a semiconductor light-emitting diode via a chip supply part according to an embodiment of the present disclosure, FIG. 28 is a block diagram of configurations of a chip supply part according to an embodiment of the present disclosure, and FIG. 29 is an enlarged view showing a method of supplying a semiconductor light-emitting diode to a substrate via a chip supply part according to an embodiment of the present disclosure.

A device for self-assembling semiconductor light-emitting diodes according to the present disclosure can be for placing semiconductor light-emitting diodes C at predetermined positions on a substrate S accommodated in an assembly chamber 500 in which a fluid is accommodated by using an electric field and a magnetic field.

According to the present disclosure, the self-assembly device can be provided in the assembly chamber 500, and can include a chip supply part 1000 which supplies the semiconductor light-emitting diodes C to one surface of the substrate S in cooperation with magnets 313 (or magnet array 313*a*) disposed in a plurality of rows to form the magnetic field.

According to the present disclosure, a process of supplying the semiconductor light-emitting diodes C to the substrate S for self-assembly can be performed by the magnet array 313*a* disposed at an upper portion of the substrate S and the chip supply part 1000 according to the present disclosure provided in the assembly chamber 500 disposed at a lower portion of the substrate S. In addition, the substrate S and the chip supply part 1000 can be disposed in the fluid.

According to an embodiment of the present disclosure, the chip supply part 1000 can include a chip accommodating part (or chip accommodator) 1010, a horizontal moving part (or a horizontal mover) 1020, a vertical moving part (or a vertical mover) 1030, and a controller 1040 controlling the same. In embodiments, the horizontal moving part 1020 and the vertical moving part 1030 may be integrated into one mover, or the functions of the horizontal moving part 1020 and the vertical moving part 1030 can be performed by one mover.

The chip accommodating part 1010 is a part in which the semiconductor light-emitting diodes C for self-assembly are accommodated, and can be an upper surface or a part of the upper surface of the chip supply part 1000 facing the substrate S, and for example, can have a plate shape which is constant in height or flat, or can be a container shape, for example.

The semiconductor light-emitting diodes C accommodated in the chip accommodating part 1010 can be supplied to an assembly surface of the substrate S by the magnetic field formed by the magnet array 313*a*. At this time, in order for the semiconductor light-emitting diodes C accommodated in the chip accommodating part 1010 to be affected by the magnetic field, a distance between the magnet array 313*a* and the chip accommodating part 1010 should be very close (within a few mm).

Under such conditions, as the chip accommodating part 1010 having a curved shape adjusts a distance such that a part of regions that are not affected by the magnetic field is included or all regions are included within the magnetic field, there is a problem that the semiconductor light-emitting diode C can be damaged due to contact of some regions with the substrate. Therefore, the chip accommodating part 1010 preferably has a plate shape with a constant height.

However, in the present embodiment, a sidewall having a predetermined height can be formed along a circumference of the chip accommodating part 1010 to prevent the semiconductor light-emitting diodes C from being separated from the chip accommodating part 1010. A height of the sidewall can be set within a range in which the above-described problem does not occur.

In addition, an area of the chip accommodating part 1010 can be formed to be at least larger than a cross-sectional area of an individual magnet 313.

The horizontal moving part 1020 can move the chip supply part 1000 in a horizontal direction such that the chip accommodating part 1010 is alternately overlapped with some of the magnets 313. Here, the horizontal movement can mean a movement (movement on an xy plane) on a surface substantially parallel to a bottom surface of the assembly chamber 500.

The vertical moving part 1030 can adjust a distance between the chip supply part 1000 and the magnets 313, in detail, the distance between the chip accommodating part 1010 in which the semiconductor light-emitting diodes C are accommodated and the magnets 313 by moving the chip supply part 1000 in a vertical direction. Here, the vertical movement can mean a movement (movement on a z-axis) in a height direction of the assembly chamber 500.

Further, the horizontal moving part 1020 and the vertical moving part 1030 can be driven simultaneously (moving on an xz plane and/or a yz plane). At this time, the height of the chip supply part 1000 and the magnet 313 or the magnets overlapped with the chip accommodating part 1010 can also be different from each other.

Meanwhile, the horizontal moving part 1020 and the vertical moving part 1030 are illustrated in a form of a transfer rail in drawings, but it is merely one embodiment, and the embodiment is not limited thereto and can be implemented in various forms.

The chip supply part 1000 according to an embodiment of the present disclosure can include a controller 1040. The controller 1040 can drive the horizontal moving part 1020 and the vertical moving part 1030 to control a position of the chip supply part 1000 in the assembly chamber 500.

The controller 1040 can move the chip supply part 1000 in at least one of the horizontal direction and the vertical direction at a predetermined path and a plurality of points existing on the predetermined path.

In the present embodiment, the horizontal movement of the chip supply part 1000 is for uniformly supplying the semiconductor light-emitting diodes C to the assembly surface of the substrate S entirely, and the vertical movement is for inducing the semiconductor light-emitting diodes C to the assembly surface of the substrate S via a magnetic force.

In the present embodiment, the predetermined path can be set to sequentially be overlapped with the magnet array 313*a* disposed at the upper portion of the substrate S, for example, can be a path that progresses in each row.

In the present embodiment, the plurality of points can be all or a part of the points overlapped with the individual magnets 313, and details will be described later. In addition, according to the present embodiment, the plurality of points can be points at which a vertical movement of the chip supply part 1000 is performed.

The controller 1040 can horizontally move the chip supply part 1000 such that the chip accommodating part 1010 is alternately overlapped with the individual magnets 313 for loading the semiconductor light-emitting diodes C accommodated in the chip accommodating part 1010, and can vertically move the chip supply part 1000 such that the semiconductor light-emitting diodes C accommodated in the chip accommodating part 1010 are supplied to a region of the substrate S overlapped with the individual magnets 313. Such a process can be repeatedly performed until the self-assembly process with respect to the entire substrate S is completed.

The controller 1040 can move the chip accommodating part 1010 between a first height a2 and a second height a1.

The first height a2 can be a height which is not affected by the magnetic field formed by the magnet array 313*a*, and the second height a1 can be a height which is affected by the magnetic field formed by the magnet array 313*a*. Therefore, when the chip accommodating part 1010 is positioned at the first height a2, the semiconductor light-emitting diodes C may not be separated from the chip accommodating part 1010.

According to an embodiment of the present disclosure, the chip supply part 1000 for supplying the semiconductor light-emitting diodes C to the substrate S can be driven based on the above described contents, and can be driven in various paths within a range not departing from the above, and will be further described later.

When the chip accommodating part 1010 is positioned at a height which is affected by the magnetic field formed by the magnet array 313*a*, that is, the second height a1, the controller 1040 can stop the horizontal movement and the vertical movement of the chip supply part 1000 for a predetermined time such that a sufficient amount of the semiconductor light-emitting diodes C are supplied to the assembly surface of the substrate S.

For example, the chip supply part 1000 can be disposed such that the chip accommodating part 1010 is positioned at the second height a1 at the plurality of points described above. The predetermined time can be determined according to various factors that can affect an amount of semiconductor light-emitting diodes C induced to the assembly surface of the substrate S such as a distance between the substrate S and the chip accommodating part 1010, strength of the magnetic field formed by the magnet array 313*a*, and the like.

In addition, the controller 1040 can adjust the predetermined time. For this, a configuration for monitoring the substrate S or the chip accommodating part 1010 can be further provided in order to check a state of supplying the semiconductor light-emitting diodes C.

For example, when the chip supply part 1000 is positioned at the second height a1 for a predetermined time in order to supply the semiconductor light-emitting diodes C at any one of the plurality of points, but it is confirmed that the semiconductor light-emitting diodes C are not sufficiently provided, it is possible to increase a time of staying at the second height a1 at the point.

As described above, the chip supply part 1000 can move vertically such that the chip accommodating part 1010 is positioned at the second height a1 in order to supply the semiconductor light-emitting diodes C to a surface of the substrate S at the plurality of points existing on the predetermined path.

At this time, the plurality of points can be points at which the chip accommodating part 1010 in which the semiconductor light-emitting diodes C are accommodated and at least one magnet 313 constituting the magnet array 313*a* disposed at the upper portion of the substrate S are overlapped with each other.

In other words, the chip supply part 1000 can raise the chip accommodating part 1010 from the first height a2 to the second height a1 at the point overlapping with at least one magnet 313 constituting the magnet array 313*a* disposed at the upper portion of the substrate S.

Meanwhile, since the individual magnets 313 constituting the magnet array 313*a* are arranged at least at a predetermined pitch in rows formed by the individual magnets 313, the plurality of points can also be present at a predetermined pitch, and accordingly, the chip supply part 1000 can move vertically after moving by the predetermined pitch.

However, when the chip supply part 1000 always moves at the same pitch, the semiconductor light-emitting diodes C accommodated at a specific point of the chip accommodating part 1010 are mainly supplied to the substrate S, and thus as the process proceeds, the other semiconductor light-emitting diodes C tend to be concentrated at both sides of the chip accommodating part 1010.

Accordingly, the controller 1040 adjusts a movement distance of the chip supply part 1000 by applying an offset for each point, so that the individual magnets 313 at each point can overlap with different points of the chip accommodating part 1010. For example, an offset value can be applied differently depending on a number of magnets 313 constituting a magnetic field forming part 300.

Figure 31:
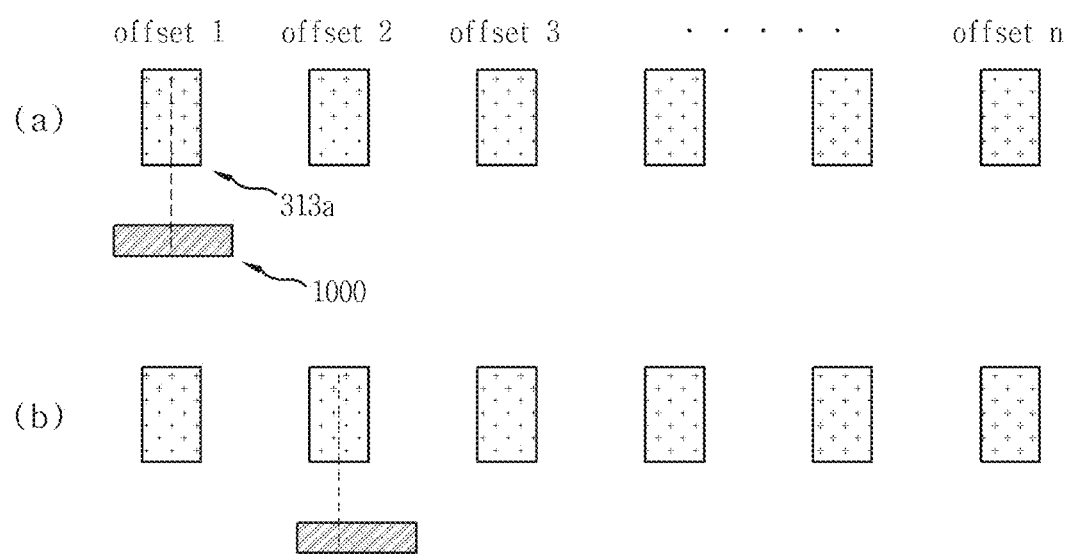
FIG. 31 is a view showing a path (offset setting) of a chip supply part according to another embodiment of the present disclosure.

Alternatively, the controller 1040 can adjust the movement distance of the chip supply part 1000 on the basis of an amount and distribution state of the semiconductor light-emitting diodes C remaining in the chip accommodating part 1010 monitored by a sensor unit in cooperation with the sensor unit to be described later (see FIG. 31).

Hereinafter, various embodiments of the path of the chip supply part 1000 will be described.

According to one embodiment, the plurality of points at which the vertical movement of the chip supply part 1000 is performed can be points overlapping with all the individual magnets 313 constituting the magnetic field forming part 300. At this point, the chip supply part 1000 can be driven so as to move upwardly (first height→second height) and move downwardly (second height→first height) at the plurality of points.

That is, the chip supply part 1000 can move upwardly and downwardly at each point, and move upwardly and downwardly at least a number of times corresponding to the number of magnets 313 constituting the magnetic field forming part 300.

According to the above embodiment, there is an advantage that the semiconductor light-emitting diodes C can be most uniformly loaded onto all the individual magnets 313 constituting the magnetic field forming part 300.

In another embodiment, the plurality of points can be one end and the other end of each row composed of a plurality of individual magnets 313, and the chip supply part 1000 can be driven to move upwardly and downwardly at the plurality of points.

Figure 30:
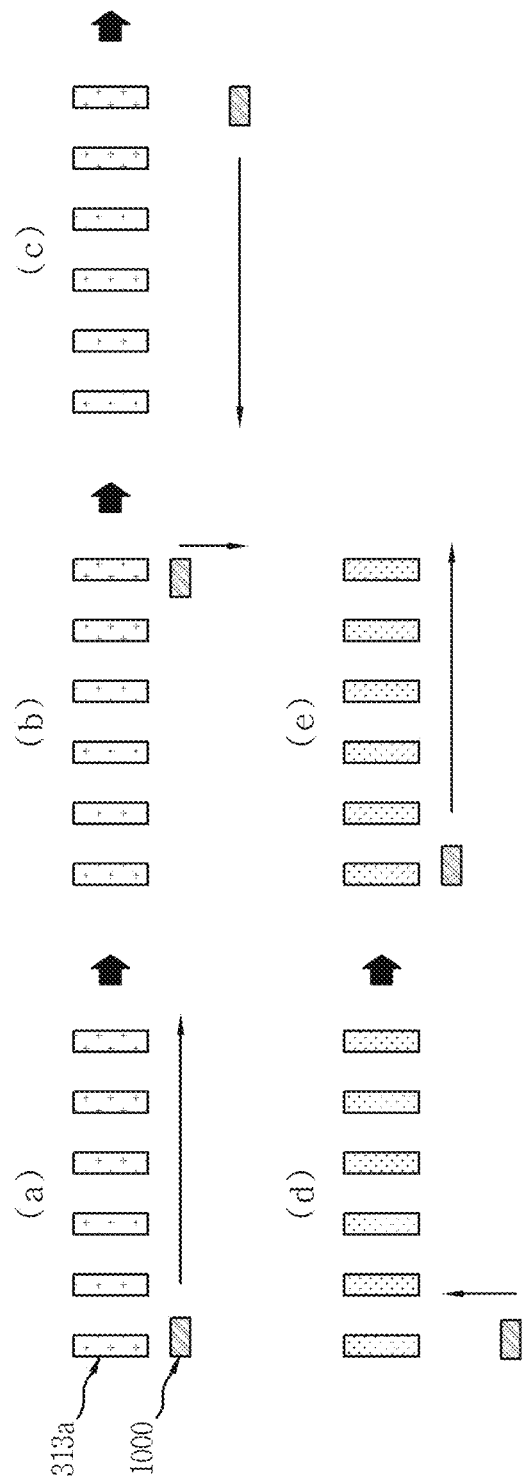
FIG. 30 is a view showing a path of a chip supply part according to an embodiment of the present disclosure.

That is, the chip supply part 1000 is the same as the above-described embodiment in that all the upward movement and downward movement are performed at each point, but the chip supply part 1000 is different from the above-described embodiment in that the upward movement and downward movement are performed at one end and the other end of the rows consisting of at least the plurality of individual magnets 313. As shown in (a) and (e) of FIG. 30, the chip supply part 1000 sweeps from the one end to the other end at the second height, as shown in (b) of FIG. 30, the chip supply part 1000 engages in the downward movement from the second height to the first height, as shown in (c) of FIG. 30, the chip supply part 1000 sweeps from the other end to the one end at the first height, and as shown in (d) of FIG. 30, the chip supply part 1000 engages in the upward movement from the first height to the second height.

According to the above embodiment, there is an advantage that assembly efficiency can be improved by shortening the movement path in the vertical direction of the chip supply part 1000.

According to still another embodiment, the plurality of points can be points overlapping with all individual magnets 313 constituting the magnetic field forming part 300. At this point, the chip supply part 1000 can be driven so as to move upwardly or downwardly at the plurality of points (see (a) and (b) of FIG. 31). In addition, in the present embodiment, the horizontal movement and the vertical movement can be performed simultaneously.

Specifically, the chip supply part 1000 can move to an adjacent another point from any one point of a plurality of points while changing the height of the chip accommodating part 1010 (from first height to second height or from second height to first height), and can move upwardly or downwardly after reaching the another point. Thereafter, the chip supply part 1000 can move while changing the height of the chip accommodating part 1010 toward the other point adjacent to still another point. That is, the chip supply part 1000 can selectively move upwardly and downwardly at a plurality of points.

According to the above embodiment, the chip supply part 1000 can supply the semiconductor light-emitting diodes C to the substrate S while moving along a shortest movement path.

Meanwhile, the self-assembly device 160 according to the present disclosure can further include a sensor unit (or sensor) 1060 for monitoring an amount (or number) and distribution state of the semiconductor light-emitting diodes C remaining on the chip accommodating part 1010 during the process of self-assembly. For example, the sensor unit can be an optical sensor, and the controller 1040 can control driving of the chip supply part (or a chip supplier) 1000 by reflecting a result monitored by the optical sensor. However, a type of the sensor unit is not limited thereto.

As described above, the sensor unit can reduce deviation of the semiconductor light-emitting diodes C supplied to each of points of the substrate S according to feedback of a supply state of the semiconductor light-emitting diodes C in real time. Further, there is an effect that the semiconductor light-emitting diodes C can be uniformly supplied.

Meanwhile, the sensor unit can be provided at various positions according to characteristics of the self-assembly device.

In an embodiment, when the chip supply part 1000 is formed of a light-transmissive transparent material, the sensor unit can be disposed at a lower portion of the chip supply part 1000, and can monitor the chip accommodating part 1010 while moving together with the chip supply part 1000. At this time, the sensor unit can be disposed together with the chip supply part 1000 in the assembly chamber 500 or can be disposed outside the assembly chamber 500.

As described above, the self-assembly device according to an embodiment of the present disclosure can uniformly supply the semiconductor light-emitting diodes C to the assembly surface of the substrate S, and an assembly time is shortened, and thus there is an effect that the self-assembly process can be introduced efficiently at a large area substrate.

The above-described disclosure is not limited to the configuration and method of embodiments described above, and the above embodiments can be configured by selectively combining all or part of each of embodiments such that various modifications can be performed.

What is claimed is:

1. A device for self-assembling semiconductor light-emitting diodes for placing the semiconductor light-emitting diodes at predetermined positions on a substrate by using an electric field and a magnetic field, the substrate being accommodated in an assembly chamber accommodating a fluid, the device comprising:
  a chip supply part disposed in the assembly chamber and configured to supply the semiconductor light-emitting diodes to one surface of the substrate in cooperation with at least one magnet to form the magnetic field,
  wherein the chip supply part comprises:
    a chip accommodating part configured to accommodate the semiconductor light-emitting diodes;
    a vertical moving part configured to adjust a distance between the chip supply part and the at least one magnet;
    a horizontal moving part configured to move the chip supply part such that the chip accommodating part is alternately overlapped with a part of the at least one magnet; and
    a controller configured to drive the vertical moving part and the horizontal moving part to control a position of the chip supply part in the assembly chamber,
  wherein the controller moves the chip supply part in at least one of a horizontal direction and a vertical direction at a predetermined path and a plurality of points existing on the predetermined path, and
  wherein, when a plurality of magnets including the at least one magnet are provided, the plurality of magnets are disposed in a plurality of rows.

2. The device for self-assembling semiconductor light-emitting diodes of claim 1,
  wherein the controller moves the chip accommodating part of the chip supply part between a first height and a second height, and
  wherein the first height is a height which is not affected by the magnetic field formed by the at least one magnet, and the second height is a height which is affected by the magnetic field formed by the at least one magnet.

3. The device for self-assembling semiconductor light-emitting diodes of claim 2, wherein the controller stops a horizontal movement and a vertical movement of the chip supply part for a predetermined time such that the semiconductor light-emitting diodes are supplied to the substrate while the chip accommodating part is positioned at the second height.

4. The device for self-assembling semiconductor light-emitting diodes of claim 3, wherein the controller adjusts a time at which the horizontal movement and the vertical movement of the chip supply part are stopped.

5. The device for self-assembling semiconductor light-emitting diodes of claim 2, wherein the controller moves the chip accommodating part to the second height at a point at which the chip accommodating part is overlapped with at least one of the plurality of magnets.

6. The device for self-assembling semiconductor light-emitting diodes of claim 2, wherein the controller drives the chip supply part such that the chip supply part has a rising path and a lowering path at each of the plurality of points.

7. The device for self-assembling semiconductor light-emitting diodes of claim 6, wherein the plurality of points include one end and the other end of the plurality of rows in which the plurality of magnets are disposed.

8. The device for self-assembling semiconductor light-emitting diodes of claim 2, wherein the controller drives the chip supply part such that the chip supply part has any one of a rising path and a lowering path at each of the plurality of points.

9. The device for self-assembling semiconductor light-emitting diodes of claim 2, further comprising:
  a sensor unit configured to monitor an amount and distribution state of the semiconductor light-emitting diodes remaining on the chip accommodating part.

10. The device for self-assembling semiconductor light-emitting diodes of claim 2, wherein the controller adjusts a region of the chip accommodating part overlapped with at least one of the plurality of magnets at the plurality of points.

11. A device for self-assembling semiconductor light-emitting diodes at predetermined positions on a substrate by using an electric field and a magnetic field, the device for self-assembling semiconductor light-emitting diodes comprising:
  a chip supplier to supply the semiconductor light-emitting diodes to one surface of the substrate in cooperation with at least one magnet disposed to form the magnetic field,
  wherein the chip supplier comprises:
    a chip accommodator to accommodate the semiconductor light-emitting diodes;
    a mover to move the chip supplier relative to the at least one magnet; and
    a controller to control a position of the chip supplier via the mover,
  wherein the controller moves the chip supplier at least one of a horizontal direction and a vertical direction at a predetermined path and a plurality of points existing on the predetermined path relative to the at least one magnet, and
  wherein, when a plurality of magnets including the at least one magnet are provided, the plurality of magnets are disposed in a plurality of rows.

12. The device for self-assembling semiconductor light-emitting diodes of claim 11, wherein the mover includes a vertical moving part to adjust a distance between the chip supply part and the at least one magnet; and
  a horizontal moving part to move the chip supply part to be alternately overlapped with a part of the at least one magnet.

13. The device for self-assembling semiconductor light-emitting diodes of claim 11, wherein the controller moves the chip accommodator between a first height and a second height, and
  wherein the first height is a height which is not affected by the magnetic field formed by the at least one magnet, and the second height is a height which is affected by the magnetic field formed by the at least one magnet.

14. The device for self-assembling semiconductor light-emitting diodes of claim 13, wherein the second height is closer to the at least one magnet than the first height.

15. The device for self-assembling semiconductor light-emitting diodes of claim 13, wherein the controller moves the chip accommodating part to the second height at a point at which the chip accommodating part is overlapped with at least one of a plurality of magnets that include the at least one magnet.

16. The device for self-assembling semiconductor light-emitting diodes of claim 11, wherein the controller stops a horizontal movement and a vertical movement of the chip supplier for a predetermined time to supply the semiconductor light-emitting diodes to the substrate while the chip accommodating part is positioned at the second height.

17. The device for self-assembling semiconductor light-emitting diodes of claim 11, wherein the controller drives the chip supplier such that the chip supplier rise and lower at each of the plurality of points.

18. The device for self-assembling semiconductor light-emitting diodes of claim 17, wherein the plurality of points include one end and the other end of the plurality of rows in which the plurality of magnets are disposed.

19. The device for self-assembling semiconductor light-emitting diodes of claim 11, further comprising a sensor unit to monitor an amount and distribution state of the semiconductor light-emitting diodes remaining on the chip accommodator.

20. The device for self-assembling semiconductor light-emitting diodes of claim 11, wherein the controller adjusts a region of the chip accommodator overlapped with at least one of the plurality of magnets at the plurality of points.

\* \* \* \* \*